US012151751B2

(12) United States Patent
Akin et al.

(10) Patent No.: US 12,151,751 B2
(45) Date of Patent: Nov. 26, 2024

(54) TRACTION MODULE FOR ROBOT WITH VARIABLE EXTENSION POSITIONS

(71) Applicants: GENERAL ELECTRIC COMPANY, Schenectady, NY (US); HIBOT CORPORATION, Tokyo (JP)

(72) Inventors: Selim Akin, Kocaeli (TR); Selami Haydar Icli, Baden (CH); Giacomo Cimarelli, Tokyo (JP); Paulo Cesar Debenest, Tokyo (JP); Michele Guarnieri, Tokyo (JP); Giorgio Valsecchi, Zürich (CH)

(73) Assignees: GE Infrastructure Technology LLC, Greenville, SC (US); Hibot Corporation, Tokyo (JP)

(*) Notice: Subject to any disclaimer, the term of this patent is extended or adjusted under 35 U.S.C. 154(b) by 254 days.

(21) Appl. No.: 17/753,121

(22) PCT Filed: Aug. 14, 2020

(86) PCT No.: PCT/US2020/046277
§ 371 (c)(1),
(2) Date: Feb. 18, 2022

(87) PCT Pub. No.: WO2021/034630
PCT Pub. Date: Feb. 25, 2021

(65) Prior Publication Data
US 2022/0289323 A1 Sep. 15, 2022

(30) Foreign Application Priority Data
Aug. 20, 2019 (EP) .................... 19404003

(51) Int. Cl.
*B62D 57/024* (2006.01)
*B25J 5/00* (2006.01)
*G01R 31/34* (2020.01)

(52) U.S. Cl.
CPC ............ *B62D 57/024* (2013.01); *B25J 5/005* (2013.01); *B25J 5/007* (2013.01); *G01R 31/34* (2013.01)

(58) Field of Classification Search
CPC .... B62D 57/024; B62D 57/02; B62D 55/075; B25J 5/005; B25J 5/007; B25J 5/00; B25J 19/02; G01R 31/34
See application file for complete search history.

(56) References Cited

U.S. PATENT DOCUMENTS 4,677,865 A 7/1987 Lehmann
4,683,973 A 8/1987 Honjo et al.
(Continued)

FOREIGN PATENT DOCUMENTS

CH 669127 A5 2/1989
EP 0171633 A1 2/1986
(Continued)

OTHER PUBLICATIONS

U.S. Appl. No. 15/652,859 Office Action dated Feb. 19, 2019, 318889-1, 17 pages.
(Continued)

*Primary Examiner* — Jaime Figueroa
*Assistant Examiner* — Sihar A Karwan
(74) *Attorney, Agent, or Firm* — James Pemrick; Charlotte Wilson; Hoffman Warnick LLC

(57) ABSTRACT

A traction module for a robot system and a robot system using the traction module having, an outer frame and a rotating frame rotatably mounted within the outer frame. A drive system is operatively coupled to the rotating frame and configured to drive a traction drive component to propel the robot. An actuator is operatively connected to the rotating frame to controllably rotate the rotating frame. During a first portion of a rotating movement of the rotating frame, the (Continued)

drive system moves between a flat mode position relative to the outer frame and a clearance mode position in which the drive system extends outwardly from the outer frame to a greater extent than in the first position. During a second portion of the rotating movement of the rotating frame, the drive system may be positioned in a desired orientation to propel the robot.

14 Claims, 15 Drawing Sheets

(56) References Cited

U.S. PATENT DOCUMENTS

| | | | |
|---|---|---|---|
| 4,889,000 | A | 12/1989 | Jaafar et al. |
| 4,970,890 | A | 11/1990 | Jaafar et al. |
| 5,172,639 | A | 12/1992 | Wiesman et al. |
| 5,650,579 | A | 7/1997 | Hatley et al. |
| 5,788,002 | A | 8/1998 | Richter |
| 5,947,051 | A | 9/1999 | Geiger |
| 5,969,531 | A | 10/1999 | Murakami et al. |
| 6,100,711 | A | 8/2000 | Hatley |
| 6,404,189 | B2 | 6/2002 | Kwun et al. |
| 6,672,413 | B2 | 1/2004 | Moore et al. |
| 6,814,169 | B2 | 11/2004 | Moore et al. |
| 6,876,222 | B2 | 4/2005 | Fischer et al. |
| 6,889,783 | B1 | 5/2005 | Moore et al. |
| 6,917,176 | B2 | 7/2005 | Schempf et al. |
| 6,959,603 | B2 | 11/2005 | Knight et al. |
| 7,188,568 | B2 | 3/2007 | Stout |
| 7,201,055 | B1 | 4/2007 | Bagley et al. |
| 7,218,993 | B2 | 5/2007 | Yasukawa et al. |
| 7,331,436 | B1 | 2/2008 | Pack et al. |
| 7,520,189 | B2 | 4/2009 | Abbasi et al. |
| 7,600,593 | B2 | 10/2009 | Filippov et al. |
| 7,617,732 | B2 | 11/2009 | Bui et al. |
| 7,624,827 | B2 | 12/2009 | Moser et al. |
| 7,654,348 | B2 | 2/2010 | Ohm et al. |
| 7,681,452 | B2 | 3/2010 | Bagley et al. |
| 7,743,675 | B2 | 6/2010 | Moore |
| 7,866,421 | B2 | 1/2011 | Moore et al. |
| 7,891,445 | B1 | 2/2011 | McKinley et al. |
| 8,028,775 | B2 | 10/2011 | Orenbuch |
| 8,220,345 | B2 | 7/2012 | Moser et al. |
| 8,477,891 | B2 | 7/2013 | Wallace et al. |
| 8,568,299 | B2 | 10/2013 | Eno et al. |
| 8,571,711 | B2 | 10/2013 | Jacobsen et al. |
| 8,619,134 | B2 | 12/2013 | Christ |
| 8,839,684 | B2 | 9/2014 | Banowetz et al. |
| 9,031,698 | B2 | 5/2015 | Smith |
| 9,056,746 | B2 | 6/2015 | Mehrandezh et al. |
| 9,217,852 | B2 | 12/2015 | Baleine |
| D748,053 | S | 1/2016 | Herrlich et al. |
| D756,922 | S | 5/2016 | Herrlich et al. |
| 9,398,198 | B2 | 7/2016 | Choi et al. |
| 9,409,292 | B2 | 8/2016 | Smith et al. |
| 9,683,460 | B2 | 6/2017 | Moore et al. |
| 9,708,934 | B2 | 7/2017 | Moore et al. |
| 9,759,667 | B2 | 9/2017 | Miasnikov et al. |
| 9,808,140 | B2 | 11/2017 | Belson et al. |
| 9,989,970 | B1 | 6/2018 | Morey et al. |
| 10,488,350 | B2 | 11/2019 | Lakhani et al. |
| 2002/0060267 | A1* | 5/2002 | Yavnai ............... G05D 1/0038 180/7.4 |
| 2002/0104693 | A1 | 8/2002 | Moore et al. |
| 2002/0190682 | A1 | 12/2002 | Schempf et al. |
| 2004/0020002 | A1 | 2/2004 | Moore et al. |
| 2004/0099175 | A1 | 5/2004 | Perrot et al. |
| 2004/0173116 | A1 | 9/2004 | Ghorbel et al. |
| 2005/0104600 | A1 | 5/2005 | Cotton |
| 2008/0087112 | A1 | 4/2008 | Bagley et al. |
| 2008/0098832 | A1 | 5/2008 | Abbasi et al. |
| 2008/0121041 | A1 | 5/2008 | Smith et al. |
| 2008/0179115 | A1 | 7/2008 | Ohm et al. |
| 2008/0195253 | A1 | 8/2008 | Kim |
| 2008/0308324 | A1 | 12/2008 | Moser et al. |
| 2009/0120215 | A1 | 5/2009 | Jacobson et al. |
| 2009/0146680 | A1 | 6/2009 | Moser et al. |
| 2009/0171151 | A1 | 7/2009 | Choset et al. |
| 2011/0040427 | A1 | 2/2011 | Ben-Tzvi |
| 2012/0069172 | A1 | 3/2012 | Hudritsch |
| 2012/0205168 | A1 | 8/2012 | Flynn et al. |
| 2013/0231779 | A1 | 9/2013 | Purkayastha et al. |
| 2014/0022374 | A1 | 1/2014 | Brignac et al. |
| 2014/0067185 | A1 | 3/2014 | Tralshawala et al. |
| 2014/0216836 | A1 | 8/2014 | Davies et al. |
| 2014/0345384 | A1 | 11/2014 | Nguyen |
| 2015/0177156 | A1 | 6/2015 | Seo et al. |
| 2015/0233787 | A1 | 8/2015 | Eakins et al. |
| 2015/0251318 | A1 | 9/2015 | Lv |
| 2015/0323469 | A1 | 11/2015 | Clayton et al. |
| 2016/0075020 | A1 | 3/2016 | Szarski et al. |
| 2016/0239080 | A1 | 8/2016 | Marcolina et al. |
| 2017/0219533 | A1 | 8/2017 | Alford et al. |
| 2017/0362068 | A1 | 12/2017 | Cheng |
| 2018/0021945 | A1 | 1/2018 | Pettersen et al. |
| 2018/0313715 | A1 | 11/2018 | Cichosz et al. |
| 2019/0022849 | A1 | 1/2019 | Akin et al. |
| 2020/0064273 | A1 | 2/2020 | Jeong et al. |

FOREIGN PATENT DOCUMENTS

| | | |
|---|---|---|
| EP | 0390352 A2 | 10/1990 |
| EP | 0684483 A2 | 11/1995 |
| EP | 1772949 A1 | 4/2007 |
| EP | 1863153 A2 | 12/2007 |
| EP | 2345902 A1 | 7/2011 |
| EP | 2743447 A1 | 6/2014 |
| EP | 2886028 A1 | 6/2015 |
| FR | 2355236 A1 | 1/1978 |
| JP | 2002243649 A | 8/2002 |
| JP | 2007256262 A | 10/2007 |
| JP | 2016099135 A | 5/2016 |
| WO | 9702452 A1 | 1/1997 |
| WO | 2008076193 A2 | 6/2008 |
| WO | 2015095543 A1 | 6/2015 |
| WO | 2016138529 A1 | 9/2016 |
| WO | 2016141769 A1 | 9/2016 |

OTHER PUBLICATIONS

International Search Report for corresponding PCT Application No. PCT/US2018/037900 dated Sep. 13, 2018, 14 pages.
International Search Report for corresponding PCT Application No. PCT/US2018/041726 dated Oct. 29, 2018, 18 pages.
U.S. Appl. No. 15/652,680 Office Action dated Mar. 18, 2019, 316383-1, 22 pages.
International Search Report for corresponding PCT Application No. PCT/US2018/035329 dated Sep. 11, 2018, 18 pages.
International Search Report for corresponding PCT Application No. PCT/US2018/038453 dated Oct. 25, 2018, 17 pages.
International Search Report for corresponding PCT Application No. PCT/US2018/040982 dated Oct. 17, 2018, 15 pages.
U.S. Appl. No. 15/652,730 Notice of Allowance dated May 3, 2019, 316389-1, 9 pages.
International Search Report for corresponding PCT Application No. PCT/DK96/00298 dated Oct. 17, 1996, 25 pages.
U.S. Appl. No. 15/652,680, Notice of Allowance dated Jul. 17, 2019, 316383-1, 8 pages.
U.S. Appl. No. 15/652,859, Notice of Allowance dated May 15, 2019, 318889-1, 10 pages.
U.S. Appl. No. 15/652,805, Office Action dated Jun. 27, 2019, 318890-1, 13 pages.
U.S. Appl. No. 15/652,771, Office Action dated Sep. 17, 2019, 316390-1, 12 pages.
U.S. Appl. No. 15/652,771, Notice of Allowance dated Jan. 24, 2020, 316390-1, 6 pages.
International Search Report for corresponding PCT Application No. PCT/US2020/046277 dated Nov. 11, 2020, 75 pages.
International Preliminary Report on Patentability for International Application No. PCT/US2020/046277 dated Mar. 3, 2022, 9 pages.

(56) References Cited

OTHER PUBLICATIONS

International Preliminary Report on Patentability for International Application No. PCT/US2020/046 dated Mar. 3, 2022, 9 pages.
Notice of Allowance mailed Jul. 8, 2024 for U.S. Appl. No. 17/753,123, filed Feb. 18, 2022; pp. 9.

* cited by examiner

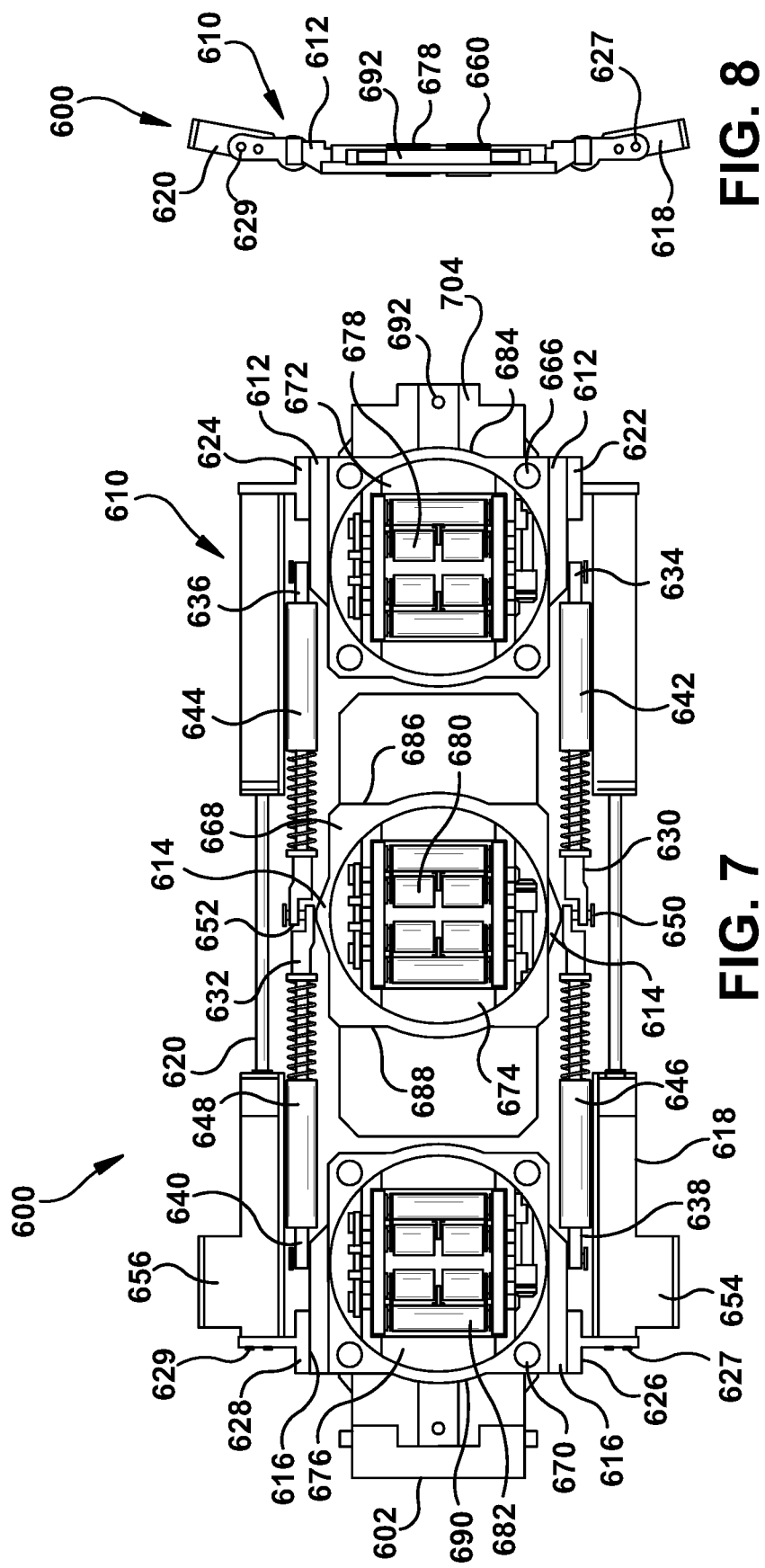

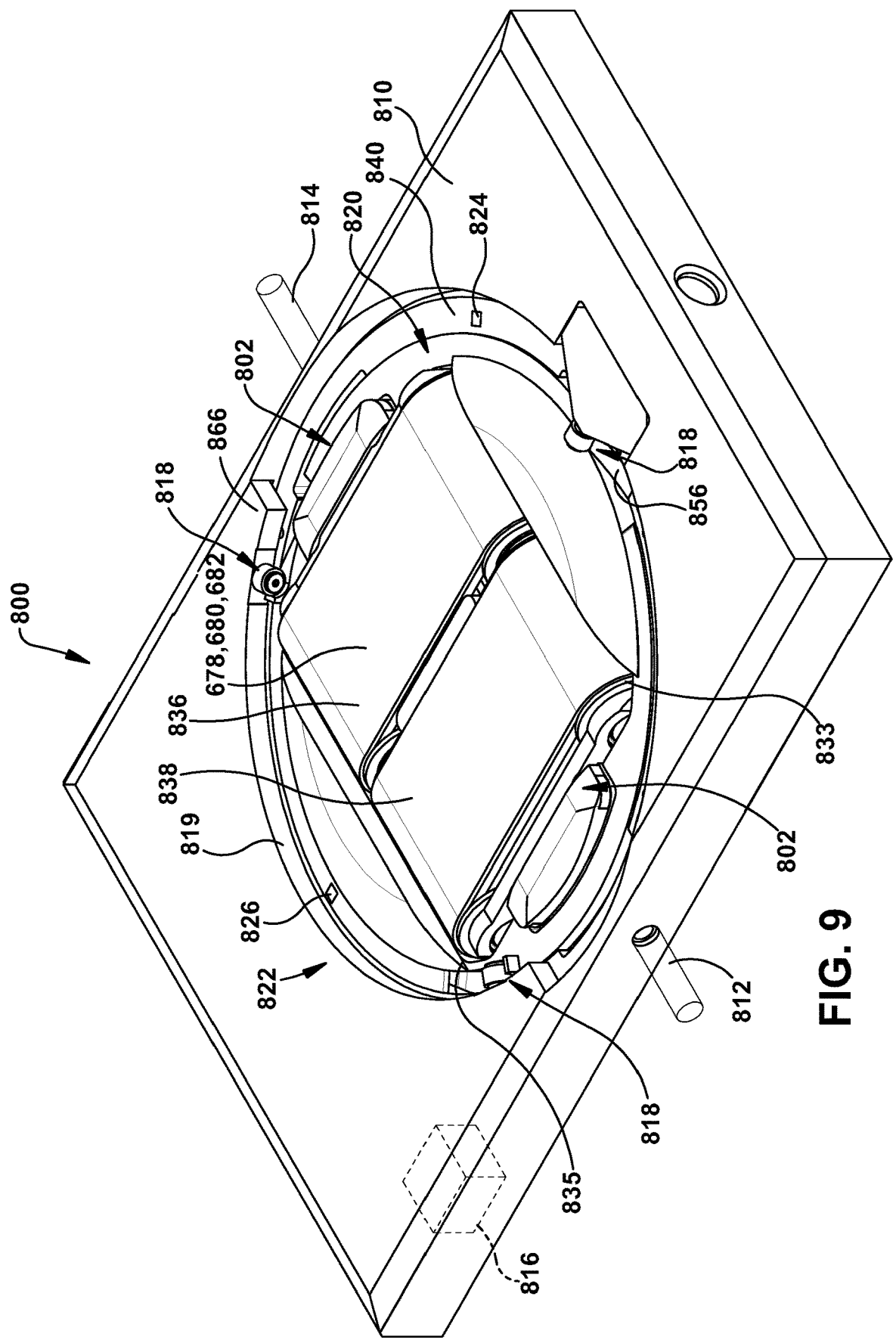

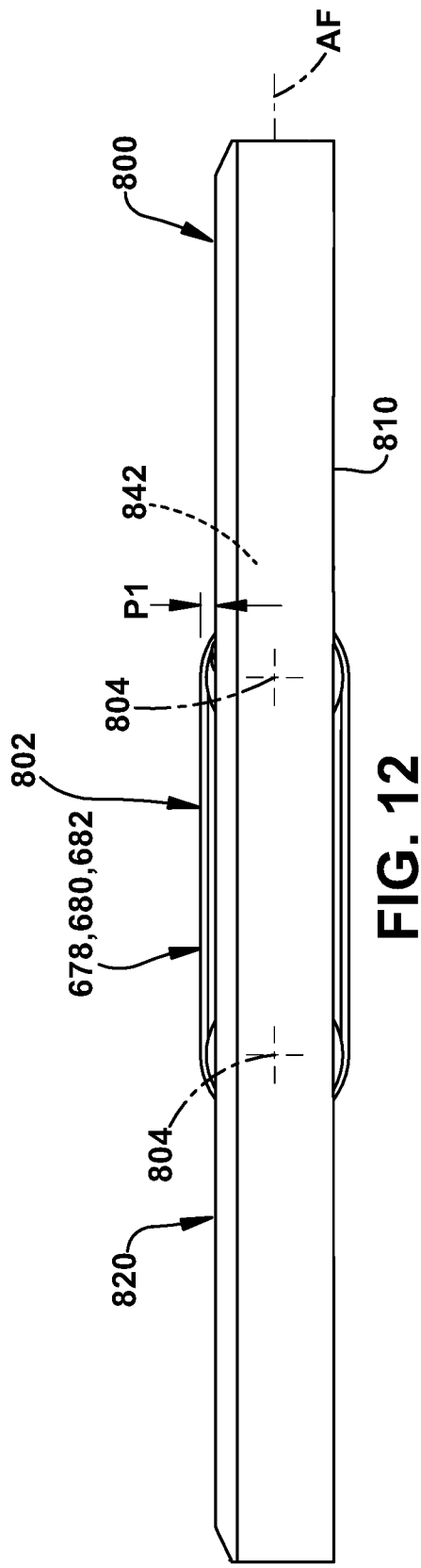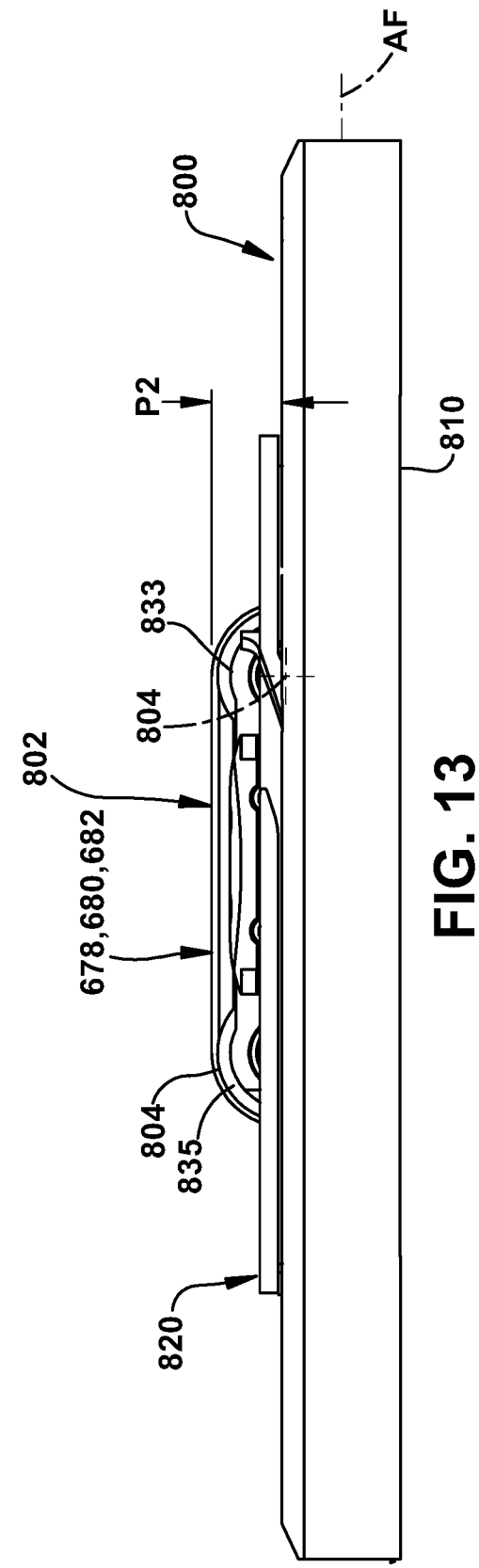

TRACTION MODULE FOR ROBOT WITH VARIABLE EXTENSION POSITIONS

BACKGROUND

The disclosure relates to robots for inspection of machinery and, more specifically, a robot for multidirectional travel along one or more surfaces of a machine.

The disclosure is related to U.S. patent application Ser. No. 15/652,680, entitled "IN-SITU GAP INSPECTION ROBOT SYSTEM AND METHOD" (GE 316383-1); Ser. No. 15/652,730, entitled "MODULAR CRAWLER ROBOT FOR IN SITU GAP INSPECTION" filed Jul. 18, 2017 (GE 316389-1); Ser. No. 15/652,771, entitled "END REGION INSPECTION MODULE AND METHOD FOR IN SITU GAP INSPECTION ROBOT SYSTEM" filed Jul. 18, 2017 (GE 316390-1); Ser. No. 15/652,859, entitled "OMNIDIRECTIONAL TRACTION MODULE FOR A ROBOT" filed Jul. 18, 2017 (GE 318889-1); Ser. No. 15/652,805, entitled "ACTUATED SENSOR MODULE AND METHOD FOR IN SITU GAP INSPECTION ROBOTS" filed Jul. 18, 2017 (GE 318890-1). The entire contents of each of these related applications is hereby incorporated herein by reference.

The disclosure is also related to concurrently filed U.S. National Phase patent application Serial Number: PCT/US2020/046277, entitled "SENSOR INTERFACE MODULE WITH SCISSOR LIFT FOR PLURALITY OF SENSORS, AND VISUAL INSPECTION MODULE WITH DUAL VIEW PATHS FOR ROBOT" filed Aug. 14, 2020.

A visual and/or electrical inspection of a generator, electric motor, or turbomachine should be performed on a periodic basis. For example, generators may be inspected and tested periodically in the field for stator wedge tightness, visual surface anomalies, core imperfections, low flux, etc. Generator/stator inspection and testing procedures may require complete disassembly of the stator and removal of the generator rotor from the stator before any inspections or tests can be performed on the unit. The cost of disassembly and removal of the rotor, the time it takes for this process, and the dangers of rotor removal may impact the frequency of such inspections.

In situ inspection of generators have been performed employing poles, trolleys, scopes, and rotor turning techniques. These procedures may not accomplish the inspection task in a complete, timely, or safe manner.

BRIEF DESCRIPTION

A first aspect of this disclosure provides a traction module for a robot, the traction module comprising: an outer frame; a rotating frame rotatably mounted within the outer frame; a drive system operatively coupled to the rotating frame and configured to drive a traction drive component to propel the robot; and an actuator operatively connected to the rotating frame to controllably rotate the rotating frame to: during a first portion of a rotating movement of the rotating frame, cause the drive system to move between a first position relative to the outer frame and a second position in which the drive system extends outwardly from the outer frame to a greater extent than in the first position, and during a second portion of the rotating movement of the rotating frame, position the drive system in a desired orientation to propel the robot.

A second aspect of the disclosure provides a robot system comprising: a body frame; at least one traction module attached to the body frame, the traction module including: an outer frame; a rotating frame rotatably mounted within the outer frame; a drive system operatively coupled to the rotating frame and configured to drive a traction drive component to propel the robot; and an actuator operatively connected to the rotating frame to controllably rotate the rotating frame to: during a first portion of a rotating movement of the rotating frame, cause the drive system to move between a first position relative to the outer frame and a second position in which the drive system extends outwardly from the outer frame to a greater extent than in the first position, and during a second portion of the rotating movement of the rotating frame, position the drive system in a desired orientation to propel the robot; and a control system controlling the body frame, the drive system and the actuator.

A third aspect of the disclosure provides a method of operating a traction module for a robot, the method comprising: providing a traction module including: an outer frame; a rotating frame rotatably mounted within the outer frame; a drive system operatively coupled to the rotating frame and configured to drive a traction drive component to propel the robot; and an actuator operatively connected to the rotating frame to controllably rotate the rotating frame; and rotating the rotating frame with the actuator such that: during a first portion of a rotating movement of the rotating frame, the drive system moves between a first position relative to the outer frame and a second position in which the drive system extends outwardly from the outer frame to a greater extent than in the first position, and during a second portion of the rotating movement of the rotating frame, the drive system moves to a desired orientation to propel the robot.

The illustrative aspects of the present disclosure are arranged to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 7 shows a top view of the robotic crawler of FIG. 6 in its collapsed state.

FIG. 8 shows an end view of the robotic crawler of FIG. 6 in its collapsed state.

FIG. 9 shows a perspective view of a multidirectional traction module according to various embodiments of the disclosure.

FIG. 12 shows a side section view of a flat mode of the traction module according to various embodiments of the disclosure.

FIG. 13 shows a side view of a clearance mode of the traction module according to various embodiments of the disclosure.

Figure 1:
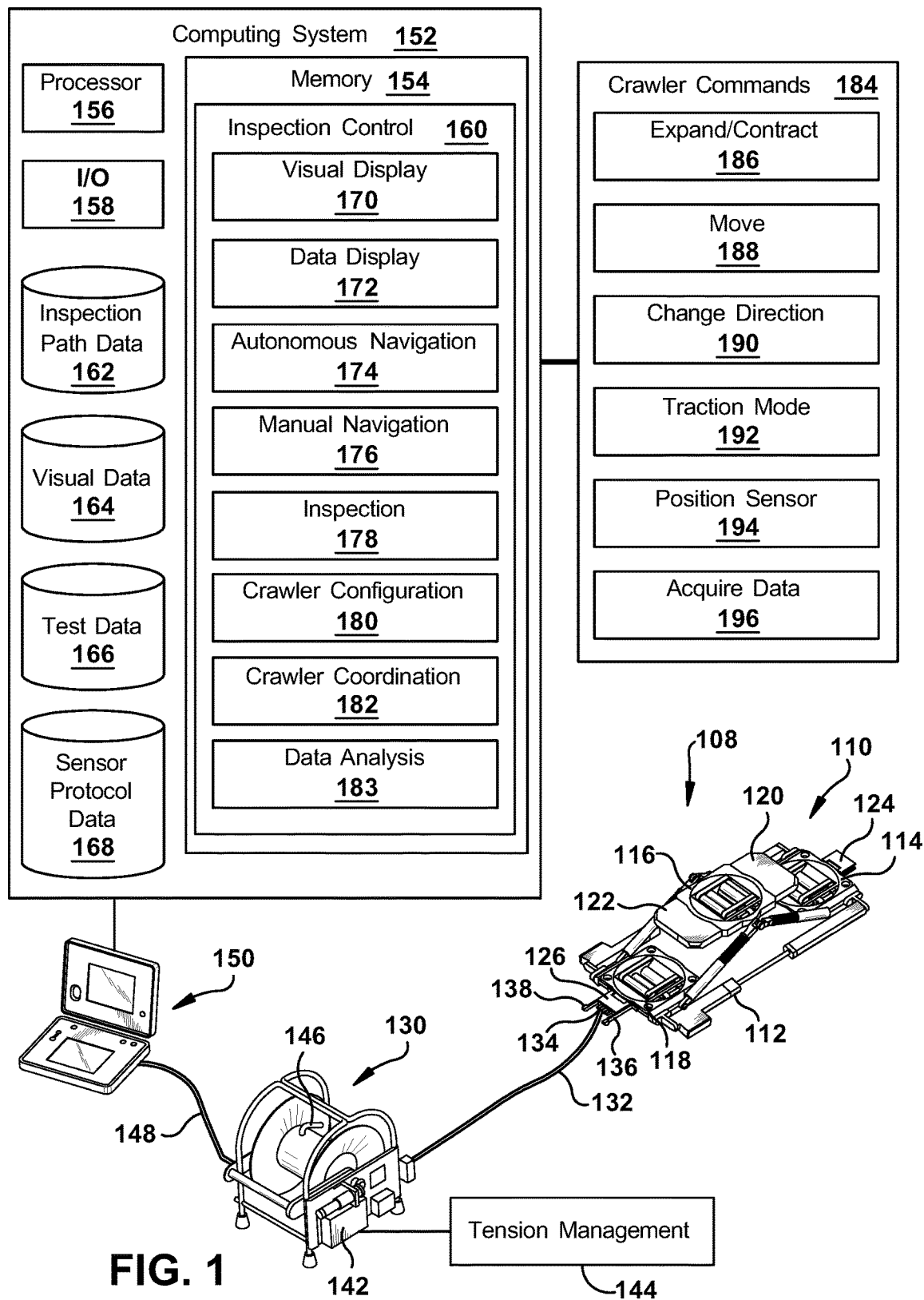
FIG. 1 shows a diagram of an example system for in situ gap inspection according to various embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

In addition, several descriptive terms may be used regularly herein, and it should prove helpful to define these terms at the onset of this section. These terms and their definitions, unless stated otherwise, are as follows. It is often required to describe parts that are at differing circumferential positions with regard to a center axis. The term "radial" refers to movement or position perpendicular to an axis, e.g., an axis of the machine. In cases such as this, if a first component resides closer to the axis than a second component, it will be stated herein that the first component is "radially inward" or "inboard" of the second component. If, on the other hand, the first component resides further from the axis than the second component, it may be stated herein that the first component is "radially outward" or "outboard" of the second component. The term "axial" refers to movement or position parallel to an axis, e.g., the rotor axis of the machine. Finally, the term "circumferential" refers to movement or position around the axis. It will be appreciated that such terms may be applied in relation to the center axis of a variety of machine configurations, e.g., of generators, electric motors, or turbomachines.

In addition, several descriptive terms may be used regularly herein, as described below. The terms "first", "second", and "third" may be used interchangeably to distinguish one component from another and are not intended to signify location or importance of the individual components.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Where an element or layer is referred to as being "on," "engaged to," "disengaged from," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Embodiments of the disclosure provide a traction module for a robot system and a robot system using the traction module. The robot may take a variety of forms such as a robotic crawler. Use of a robot employing a robotic crawler capable of insertion through the annular gap in a machine such as a generator, e.g., between the core iron and the retaining ring, permits in situ inspection of the machine parts such as the rotor and the stator core. The robotic crawler may be inserted in a collapsed position into the annular gap and expanded to the width of the air gap. One or more traction modules may drive movement of the robotic crawler. The crawler may be remotely controlled by a technician and has video cameras and other inspection tools to perform generator rotor and stator inspections within the annular gap as the robotic crawler is driven to selected locations. The crawler may be maneuvered by the technician within the annular gap using video for both navigation and visual inspection. The traction modules may include an outer frame and a rotating frame rotatably mounted within the outer frame. A drive system is operatively coupled to the rotating frame and configured to drive a traction drive component to propel the robot. An actuator is operatively connected to the rotating frame to controllably rotate the rotating frame. During a first portion of a rotating movement of the rotating frame, the drive system moves between a first (flat mode) position relative to the outer frame and a second (clearance mode) position in which the drive system extends outwardly from the outer frame to a greater extent than in the first position. During a second portion of the rotating movement of the rotating frame, the drive system may be positioned in a desired orientation to propel the robot. The rotating frame and the outer frame may include interacting members that cause the movement between the two positions. The traction module with the rotating frame combines steering and drive system lifting or extension with a single, simple solution. The traction module reduces the number of parts, complexity and costs while increasing system longevity. The less complex mechanism provides additional space for other parts such as larger traction drive components to improve traction and obstacle handling on uneven surfaces.

Referring to FIG. 1, an example robot system 100 for in situ gap inspection is shown. Robot system 100 may include a robot 108, such as a robotic crawler 110, a tether reel 130, and a control system 150. While a particular type of robot will be described herein, the teachings of the disclosure are applicable to any variety of robot for probe or sensor delivery to collect inspection data. Other types of robotic manipulators would work as long as they conform to the geometry and have enough traction/power for the desired application. Robotic crawler 110 may be configured to be inserted through an entrance gap into an annular gap in a machine to conduct autonomous or semi-autonomous inspection of the machine. For example, robotic crawler 110 may be a collapsible robot that can operate in a collapsed or expanded state and may be inserted through a narrow entrance gap in its collapsed state and expand to a wider gap width such that it engages the opposed surfaces of the annular gap. Robotic crawler 110 is shown in its expanded state in FIG. 1. Once in the annular gap, robotic crawler 110 may navigate the annular gap and use one or more sensor modules to conduct various inspection tests during its movements or at various desired crawler positions in the annular gap. Robotic crawler 110 may be configured for multidirectional movement, including forward and reverse movement in the axial direction and bi-directional lateral movement in the circumferential direction. In some embodiments, robotic crawler 110 may be configured for omnidirectional movement that includes bi-directional movement in any orientation between the axial and circumferential directions, in addition to the axial and circumferential directions. For example, robotic crawler 110 may be configured to move in any direction in a 360 degree arc and freely change its direction of travel to any orientation in the 360 degree arc, including a plurality of directions between and angled from the axial and circumferential directions. In some embodiments, robotic crawler 110 may include a tether 132 connected to robotic crawler 110 and extending out of the machine during operation. For example, tether 132 may be a cable connected to robotic crawler 110 to enable retrieval of robotic crawler 110 in the event that robotic crawler 110 cannot navigate out of the annular gap under its own power. In some embodiments, tether 132 may provide a physical connection from robotic crawler 110 for a wired communication channel and/or a remote power source and/or pneumatic or hydraulic lines to support test systems or robotic operation. Tether reel 130 may be automated to adjust the tension and/or slack on tether 132 during operation of robotic crawler 110 within the annular gap, enabling robotic crawler 110 to navigate various navigation paths and perform inspection routines without a user manually managing the position of the tether. Control system 150 may be in communication with robotic crawler 110 to provide control signals to robotic crawler 110 and receive sensor, navigation, and/or other operational data from robotic crawler 110. In some embodiments, control system 150 may be electrically connected to tether 132 directly or through tether reel 130 and the electrical connection may include one or both of a power channel and a communication channel. Control system 150 may provide a user interface for a user to monitor, evaluate, supplement, and/or control robotic crawler 110 during an inspection deployment within the annular gap of the machine.

In some embodiments, robotic crawler 110 is a modular robot formed of removable and/or interchangeable modules, one or more of which may be reconfigured for different inspection tasks and enabling efficient maintenance, replacement, and/or upgrade of individual modules. Robotic crawler 110 may include a body frame, such as an expandable body 112, for navigating an annular gap in a generator, electric motor, or turbomachine. Expandable body 112 may receive, position, and connect various modules relative to one another. In some embodiments, expandable body 112 accommodates a plurality of traction modules 114, 116, 118. For example, robotic crawler 110 may include three traction modules 114, 116, 118, a forward traction module 114, a middle traction module 116, and a rear traction module 118, where forward traction module 114 and rear traction module 118 are configured to engage a first surface in the annular gap and the middle traction module 116 is configured to engage an opposed second surface in the annular gap. Traction modules 114, 116, 118 may be multidirectional traction modules capable of moving robotic crawler 110 in multiple directions, including without limitation axial and circumferential movement within the annular gap. Robotic crawler 110 may further include a plurality of sensor modules 120, 122, such as visual sensors for navigation and/or visual inspection. For example, sensor modules 120, 122 may be attached via sensor interfaces on the body frame to the forward and rear sides of middle traction module 116 and may provide both forward and rear facing navigation cameras, as well as one or more upward facing cameras for inspecting the adjacent surface of the annular gap. Alternatively, sensor modules 120, 122 may be coupled to forward traction module 114 and/or rearward traction module 118. Robotic crawler 110 may also include one or more tether connectors 124, 126 for detachably receiving tether 132, generally with a compatible end connector 134 and fasteners 136, 138.

In some embodiments, tether reel 130 is an automated tether reel that may receive, release, and spool tether 132 to adjust tension as needed during operation of robotic crawler 110. For example, tether reel 130 may include a servo motor 142 and tension management logic 144. For example, servo motor 142 operating in a torque/current control mode may detect changes in tension on tether 132 as it enters tether reel 130 and tension management logic 144 may provide an algorithm for maintaining an acceptable tension range using servo motor 142 to reel in or reel out tether 132 under closed loop control. In some embodiments, tether 132 may have a fixed connection 146 to tether reel 130 and a separate wire 148 may connect to control system 150. For example, wire 148 may provide communication and/or power channels without providing the mechanical characteristics desired for tethering robotic crawler 110. In some embodiments, tether reel 130 may provide an interface for receiving control signals for tether reel 130 from control system 150. For example, control system 150 may be able to adjust tension control or motor parameters and/or manually override operation of tether reel 130. In some embodiments, robotic crawler 110 may operate without a tether, carry its own power (e.g., batteries), and/or use wireless communication with control system 150.

In some embodiments, control system 150 may include a computing system 152. Computing system 152 may provide a plurality of programmatic controls and user interface(s) for operating robotic crawler 110. In some embodiments, computing system 152 is a general purpose computing device, such as a personal computer, work station, mobile device, or an embedded system in an industrial control system (using general purpose computing components and operating systems). In some embodiments, computing system 152 may be a specialized data processing system for the task of controlling operation of robot system 100. Computing system 152 may include at least one memory 154, processor 156, and input/output (I/O) interface 158 interconnected by a bus. Further, computing system 152 may include communication with external I/O device/resources and/or storage systems, including connected system, such as robotic crawler 110, tether reel 130, and network resources. In general, processor 156 executes computer program code, such as inspection control module 160, that is stored in memory 154 and/or a storage system. While executing computer program code, processor 156 can read and/or write data to/from memory 154, storage systems, and I/O devices (through I/O interface 158). The bus provides a communication link between each of the components within computing system 152. I/O devices may comprise any device that enables a user to interact with computing system 152 (e.g., keyboard, pointing device, display, etc.). Computing system 152 is only representative of various possible combinations of hardware and software. For example, the processor may comprise a single processing unit, or be distributed across one or more processing units in one or more locations, e.g., on a client and server. Similarly, memory and/or storage systems may reside at one or more physical locations. Memory and/or storage systems can comprise any combination of various types of non-transitory computer readable storage medium including magnetic media, optical media, random access memory (RAM), read only memory (ROM), etc. In some embodiments, computing system 152 is a laptop computer in communication with robotic crawler 110 via a wired (serial, USB, Ethernet, etc.) or wireless (802.11, Bluetooth, etc.) connection and running application software for robot system 100. In some embodiments, some or all of the functions of computing system 152 may be on board robotic crawler 110 using an integrated computing system, such as an on board control module, with or without wireless communication to one or more user interfaces and/or remote data storage.

In some embodiments, computing system 152 may include one or more application programs, data sources, and/or functional modules for controlling robotic crawler 110. For example, computing system 152 may include inspection control module 160 that operates in conjunction with data sources 162, 164, 166, 168 to provide control signals to and receive data from robotic crawler 110. Inspection control module 160 may provide a visual display module 170. For example, visual data collected by cameras on robotic crawler 110 may be displayed by visual display module 170, such as a graphical user interface for one or more video feeds. In some embodiments, visual data from robotic crawler 110 may be stored in visual data source 164 for use by visual display module 170 and/or selective, temporary, and/or archival storage of visual data for later use, including use by other users or systems. Data display module 172 may provide display, including visual display, of other test data, including processed visual data and resulting calculations or analysis. For example, data display module 172 may include a graphical user interface for test results from one or more test protocols using sensor and navigation data from robotic crawler 110. In some embodiments, test data from robotic crawler 110 may be stored in test data source 166 for use by data display module 172 and/or selective, temporary, and/or archival storage of test data for later use, including use by other users or systems. Data display module 172 may include a real-time display of test data as it is collected by robotic crawler 110 and/or one or more functions for viewing, aggregating, analyzing, visualizing, selecting, and/or reporting test data from test data source 166. Autonomous navigation module 174 may provide a protocol or series of commands for navigation of robotic crawler 110 within the annular gap of the machine. In some embodiments, autonomous navigation module 174 enables a user to select an inspection path from a plurality of inspection paths stored in inspection path data source 162. For example, inspection paths may be defined as physical paths robotic crawler 110 should follow within the annular gap to complete one or more inspection tasks in one or more locations within the annular gap. Inspection paths may be based on a physical schematic or parameters of one or more machines defining axial and circumferential distances. Inspection paths may also include parameters and locations related to specific features of interest for either navigation (e.g., surface features to be avoided) or for testing (e.g., locations or corresponding crawler positions for conducting specific tests). In some embodiments, inspection paths may be stored and defined in terms of a sequence of crawler commands. Autonomous navigation module 174 may enable autonomous navigation by robotic crawler 110 receiving and executing a sequence of crawler commands without user intervention once the autonomous operation is initiated. In some embodiments, autonomous navigation module 174 may have completely autonomous inspection routines that require no user intervention once initiated or may include a plurality of inspection subroutines, such as specific movement patterns, position changes, or test protocols, that are initiated in a desired sequence by a user, potentially based on navigational, visual, or test data feedback. Manual navigation module 176 may provide a user with the ability to pilot or otherwise control robotic crawler 110. In some embodiments, manual navigation module 176 may be provided for establishing an initial position for initiating automated control and/or allow a user to override automated control in response to problems, exceptions, or specific test protocols (such as an initial test result that requires further data gathering). In some embodiments, control system 150 may include one or more user I/O interfaces for manually controlling robotic crawler 110, such as joysticks and other tactile controls, for navigation, deploying sensors, and conducting various test protocols. Inspection module 178 may provide a plurality of routines for various inspection protocols using one or more sensor modules. In some embodiments, one or more sensor protocols are stored in sensor protocol data source 168 for use by inspection module 178. For example, a visual inspection protocol may include activating and capturing visual data from one or more sensor modules 120, 122 on robotic crawler 110 along a defined navigation path to enable mapping of captured visual data to location information with the machine. In some embodiments, a plurality of cameras with varying facings and/or positionable cameras may be present in one or more sensor modules 120, 122 and a visual inspection module may include selective activation and positioning of robotic crawler 110 and its various cameras. An inspection protocol executed by inspection module 178 may include a combination of navigational elements (navigation path, autonomous positioning, and/or manual positioning) and sensor protocols (position requirements, deployment, activation, timing/sampling, parameters, etc.). In some embodiments, inspection module 178 may define the storage of visual data and test data in visual data source 164 and test data source 166 and/or the display of visual data by visual display module 170 and test data by data display module 172. Crawler configuration module 180 may provide data regarding the configuration of modules and related capabilities and protocols for any given configuration of robotic crawler 110. In some embodiments, crawler configuration module 180 may map crawler configurations to machine specifications and sensor protocols to assist a user in matching inspection protocols with the resources available for a given test deployment. For example, a given configuration of sensor modules may define the test capabilities of robotic crawler 110 and recommend specific inspection protocols to utilize those sensor modules. In some embodiments, crawler configuration module 180 may include a library of sensor modules and related capabilities and support user reconfiguration of robotic crawler 110 for a desired inspection protocol. Crawler configuration module 180 may also define the set of crawler commands 184 that may be used to control robotic crawler 110. Crawler coordination module 182 may enable inspection control module 160 to control more than one robotic crawler 110 simultaneously. In some embodiments, crawler coordination module 182 may maintain a plurality of communication channels for control signals and data signals with a plurality of robotic crawlers. For example, crawler coordination 182 may manage a plurality of instances of visual display module 170, data display module 172, autonomous navigation module 174, manual navigation module 176, inspection module 178, and crawler configuration module 180 for parallel management of the plurality of robotic crawlers. In some embodiments, crawler coordination module 182 may include interference protection for tracking the current crawler positions, navigation paths, and timing of various movements and sensor protocols to prevent collisions or other interference within the annular gap.

In some embodiments, visual display module 170, data display module 172, autonomous navigation module 174, manual navigation module 176, and inspection module 178 may be configured to issue one or more crawler commands 184 to robotic crawler 110 to complete some aspect of their function. Crawler commands 184 may then be translated into messages or control signals from control system 150 to robotic crawler 110. In some embodiments, crawler configuration module 180 may define the set of crawler commands available to the other modules based on the configuration of robotic crawler 110. An example set of crawler commands 184 are provided, but will be understood to be neither exclusive nor exhaustive of the possible crawler commands that could be used to control robotic crawler 110 and various configurations of traction modules, sensor modules, and body frame mechanics possible. Robotic crawler 110 may receive expand/contract commands 186 to expand or contract expandable body 112 between a collapsed state and one or more expanded states, such as a control signal to one or more motors that drive the body position. In some embodiments, expansion or contraction may be based on feedback from sensors within robotic crawler 110 when the traction modules are in a planar position (for collapsed state) or have contacted opposed surfaces in the annular gap (for expanded state). In other embodiments, expansion or contraction may be based on time (e.g., activate motor for x seconds of expansion or contraction) or distance (e.g., set crawler width to y centimeters). Robotic crawler 110 may receive move commands 188 to drive its traction modules forward or backwards (based on the present alignment of the traction modules in the case of multidirectional traction modules). Robotic crawler 110 may receive change direction commands 190 to reorient its traction modules and direction of travel. For example, change direction commands 190 may allow multidirectional traction modules to rotate 90 degrees and change from axial orientation and directions of travel to circumferential orientation and directions of travel. In some embodiments, change direction commands 190 may include orientation changes of greater or less than 90 degrees and include a feedback signal for confirming orientation of traction modules and communicating orientation back to control system 150. Robotic crawler 110 may receive traction mode commands 192 to drive changes in the configuration of the traction modules for different traction modes. For example, traction modules may include a flat mode for robot insertion and/or low profile and smooth surface travel and a clearance mode for providing clearance between the body of robotic crawler 110 and the surfaces it is moving along and/or traversing obstacles or uneven surfaces. Traction mode commands 192 may include control signals to change one or more traction modules 114, 116, 118 from a flat mode to a clearance mode or from the clearance mode to the flat mode. Robotic crawler 110 may receive position sensor commands 194 for sensor modules that include deployment and/or positioning features. For example, some sensor modules may include electromechanical features for extending, raising, lowering, rotating, or otherwise positioning one or more elements of the sensor module before, during, or after data collection. Position sensor commands 194 may include a control signal to activate a motor for extending or otherwise repositioning a sensor from robotic crawler 110 to position it for data collection or for moving a sensor (such as by rotation) independent of changing crawler position during data collection. Robotic crawler 110 may receive acquire data commands 196 for initiating data collection through a sensor module using whatever modality is present in that sensor module. Acquire data commands 196 may provide a start or stop signal for a continuous data collection mode, such as a video feed from the camera(s) of a visual sensor, or a specific test sequence for a more discrete sensor test, such as a mechanical wedge tightness test. It will be understood that some robotic crawlers and control systems may be able to communicate and manage multiple commands in parallel, as overlapping sequences, or as serial command series. Crawler coordination module 182 may enable control system 150 to issue commands to and acquire data from multiple robotic crawlers in parallel.

Figure 2:
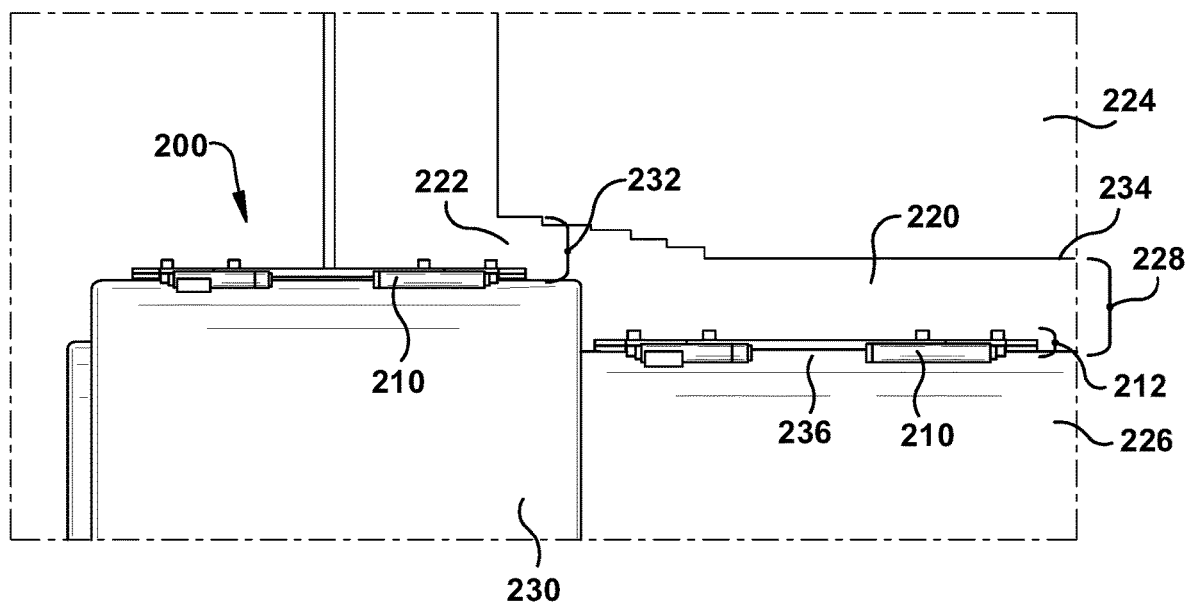
FIG. 2 shows a side section view of gap insertion of a robotic crawler into a machine.

Referring to FIG. 2, an in situ gap inspection system 200 is shown with a robotic crawler 210, such as robotic crawler 110 in FIG. 1, being inserted into the machine. The machine may be any machine including an annular gap 220 accessible through an entrance gap 222 and, more specifically, a variety of machine configurations of generators, electric motors, or turbomachines. For example, a generator may allow insertion through the annular gap between the core iron and the retaining ring, which permits in situ inspection of the rotor and the stator core. Annular gap 220 may be defined between a cylindrical central member 226 and a surrounding cylindrical member 224 with generally complementary curvature. In some embodiments, annular gap 220 may be an air gap generally defined between the inner diameter of the stator and the outer diameter of the rotor. Annular gap 220 has an axial length from a first end to a second end of cylindrical central member 226 and a circumference measured in the direction of the circumference of cylindrical central member 226. Annular gap 220 has an annular gap width 228 measured from outer surface 236 of cylindrical central member 226 to the nearest opposite surface (inner surface 234) of surrounding cylindrical member 224. Annular gap width 228 may vary circumferentially and/or axially. In some embodiments, entrance gap 222 may be an air gap at an end of cylindrical central member 226 and have the same entrance width as annular gap width 228. In other embodiments, entrance gap 222 may include additional features, such as a retaining member 230, that further constrain entrance gap 222 and define an entrance gap width 232 is that is less than annular gap width 228. In some embodiments, additional features or obstacles may reduce annular gap width 228, such as entrance baffles used to direct cooling air flow.

In FIG. 2, robotic crawler 210 is in a collapsed state, where its traction modules are aligned in a single plane. Robotic crawler 210 is shown outside entrance gap 222 before insertion and inside annular gap 220 after insertion. Robotic crawler 210 may define a collapsed crawler width 212. Collapsed crawler width 212 may be less than both entrance gap width 232 and annular gap width 228. In its collapsed state, robotic crawler 210 engages only outer surface 236 of cylindrical central member 226 inside annular gap 220.

Figure 3:
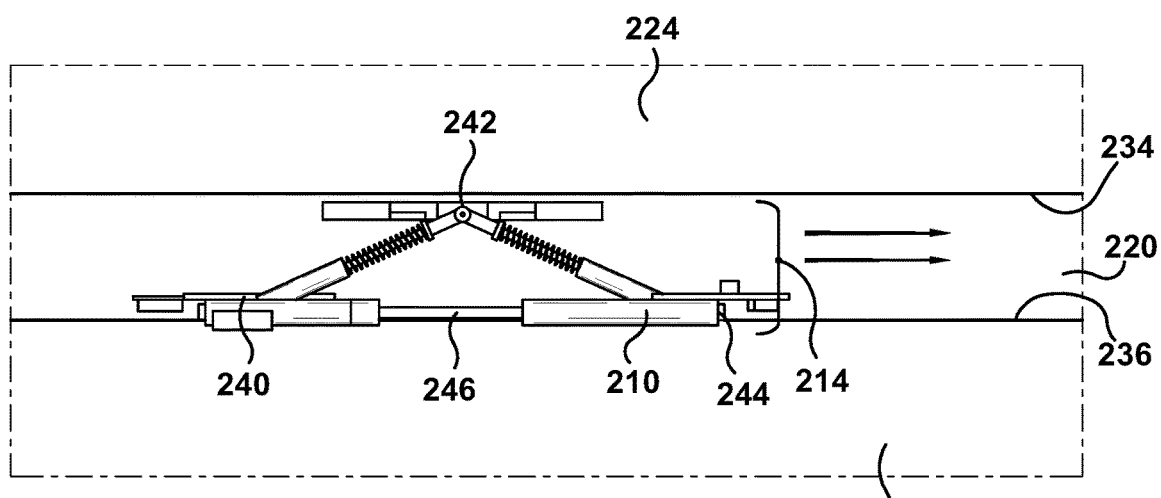
FIG. 3 shows a side section view of an expanded robotic crawler in the annular gap of a machine.
Figure 4:
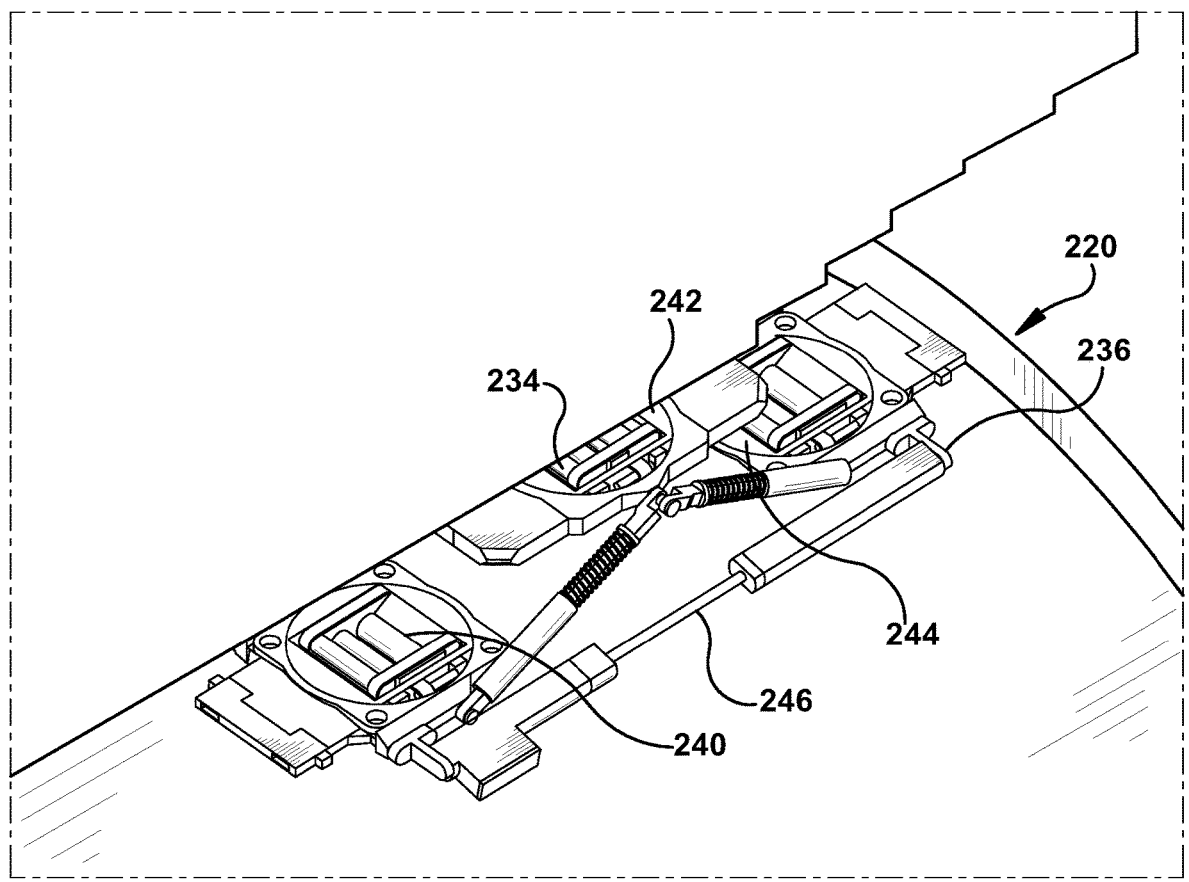
FIG. 4 shows a perspective cutaway view of an expanded robotic crawler in the annular gap of a machine according to various embodiments of the disclosure.

FIGS. 3-4 show two views of robotic crawler 210 in an expanded state within annular gap 220. When robotic crawler 210 is in its expanded state, it may engage opposed surfaces 234, 236. In an expanded state, robotic crawler 210 may define an expanded crawler width 214. Expanded crawler width 214 may be larger than collapsed crawler width 212 and entrance gap width 232, and equal to annular gap width 228 such that surface contact may be maintained with opposed surfaces 234, 236. In some embodiments, robotic crawler 210 comprises a plurality of traction modules 240, 242, 244 mounted in an expandable body 246. Traction modules 240, 244 may engage only outer surface 236 of cylindrical central member 226 and traction module 242 may engage only inner surface 234 of surrounding cylindrical central member 226. In some embodiments, the configuration of traction modules 240, 242, 244 may be reversed and traction modules 240, 244 may engage only inner surface 234 of surrounding cylindrical central member 226 and traction module 242 may engage only outer surface 236 of cylindrical central member 226. Traction modules 240, 242, 244 may include one or more traction drive components such as roller(s) like wheel(s) or ball(s) (see e.g., FIGS. 1, 4, 6, 7); or belt(s) or track(s) (see, e.g., FIG. 9), to move robotic crawler 210 through annular gap 220 based on moving surface contact with opposed surfaces 234, 236. Traction modules 240, 242, 244 may move robotic crawler 210 on a desired navigation path through annular gap 220.

Figure 5A:
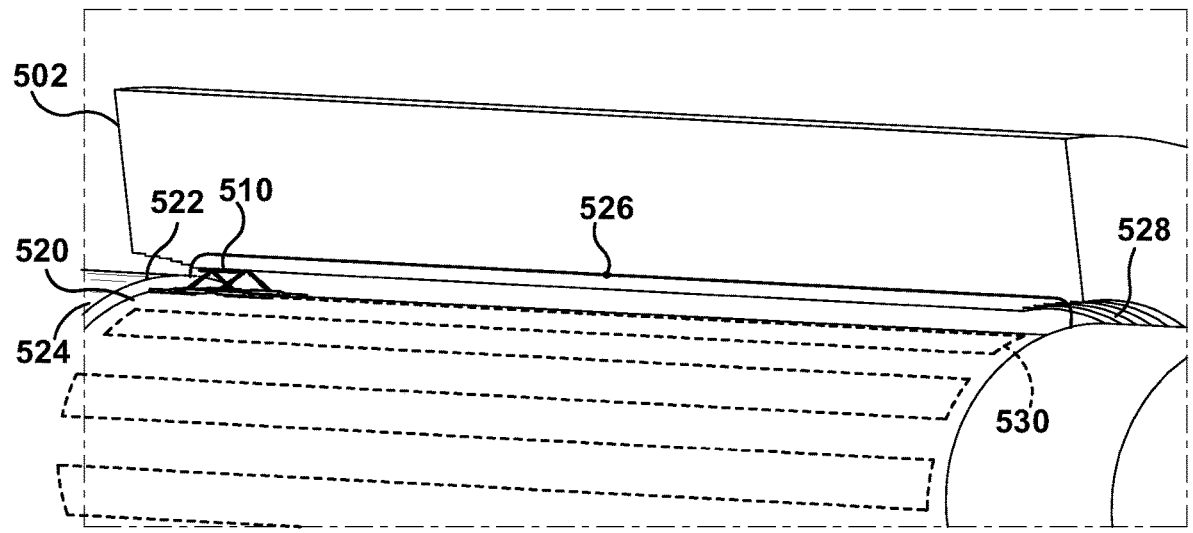
FIGS. 5A and 5B show example inspection paths of a robotic crawler in the annular gap of a machine.
Figure 5B:
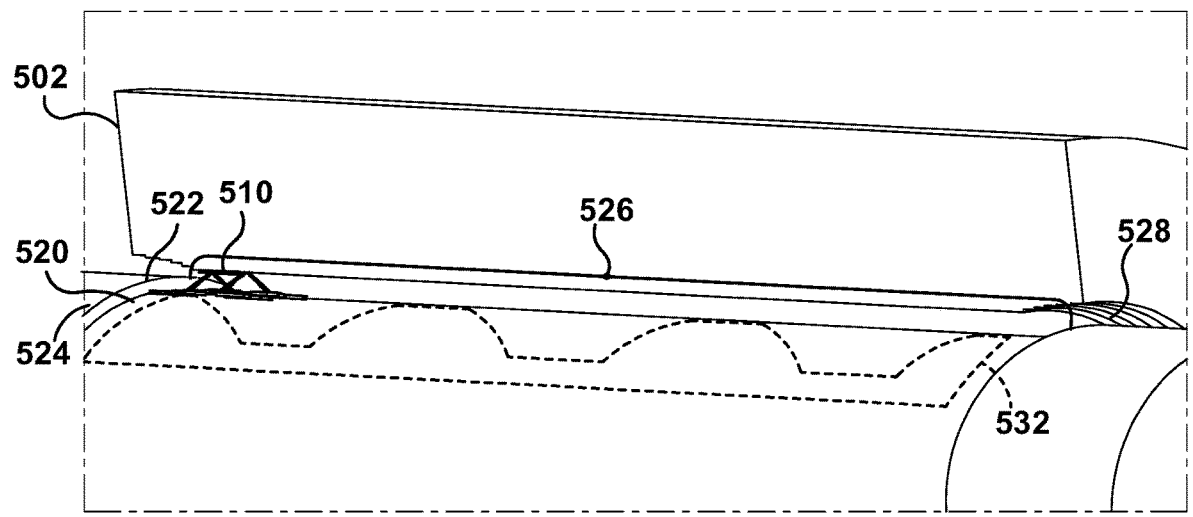

Referring to FIGS. 5A and 5B, another embodiment of a robotic crawler 510 is shown in an annular gap 520 with lines 530, 532 showing example navigation paths for inspecting annular gap 520. Robotic crawler 510 is shown in an expanded state in a starting crawler position just inside entrance gap 522 adjacent an entrance end portion 524 of the machine 502. Following line 530, robotic crawler 510 moves in a forward axial direction along a gap length 526 of annular gap 520 from the entrance end portion 524 to the closed end portion 528. In some embodiments, robotic crawler 510 may reach a step or other obstacle representing the end of the navigable gap length 526 of annular gap 520. For example, closed end portion 528 may include a step created by a retaining ring or other feature and may include another air gap into an enclosed end region of the machine. Robotic crawler 510 may include multidirectional traction modules that enable it to change its travel direction from the axial direction to the circumferential direction. Line 530 shows a number of circumferential steps along the circumference of annular gap 520. The length of the circumferential step may depend on a variety of factors related to sensor range/area (or field of view for visual sensors), test locations, desired test coverage or sampling, and/or specific machine features to be included in the navigation path to support desired test protocols using the sensor modules on robotic crawler 510. After a new circumferential position is achieved, line 530 shows a return path in the reverse axial direction along gap length 526. Robotic crawler 510 may reorient its movement direction back to an axial orientation and move in the opposite direction down the length of annular gap 520. In some embodiments, robotic crawler 510 may reach a step or other obstacle associated with entrance gap 522 and representing the end of the navigable gap length 526 of annular gap 520. Robotic crawler 510 may again reorient its travel direction for circumferential movement and make another circumferential step. Robotic crawler 510 may continue stepping through these axial passes at various circumferential positions along the circumference for the area of annular gap 520 to be inspected with the selected sensor modules and inspection protocol. In some embodiments, robotic crawler 510 may traverse the gap length in circumferential positions providing overlapping coverage for visual inspection around the entire circumference of annular gap 520 to provide a complete visual inspection of the surfaces of annular gap 520. Following line 532 shows an alternate inspection path and is provided to demonstrate that a plurality of inspection paths may be enabled by multidirectional and omnidirectional movement. Line 532 takes robotic crawler 510 along an inspection path that includes axial travel, circumferential travel, and travel along intermediate orientations between the axial and circumferential directions. More complex and less repetitious inspection paths may be used for inspection of specific areas or features, as well as to navigate around known obstacles.

Figure 6:
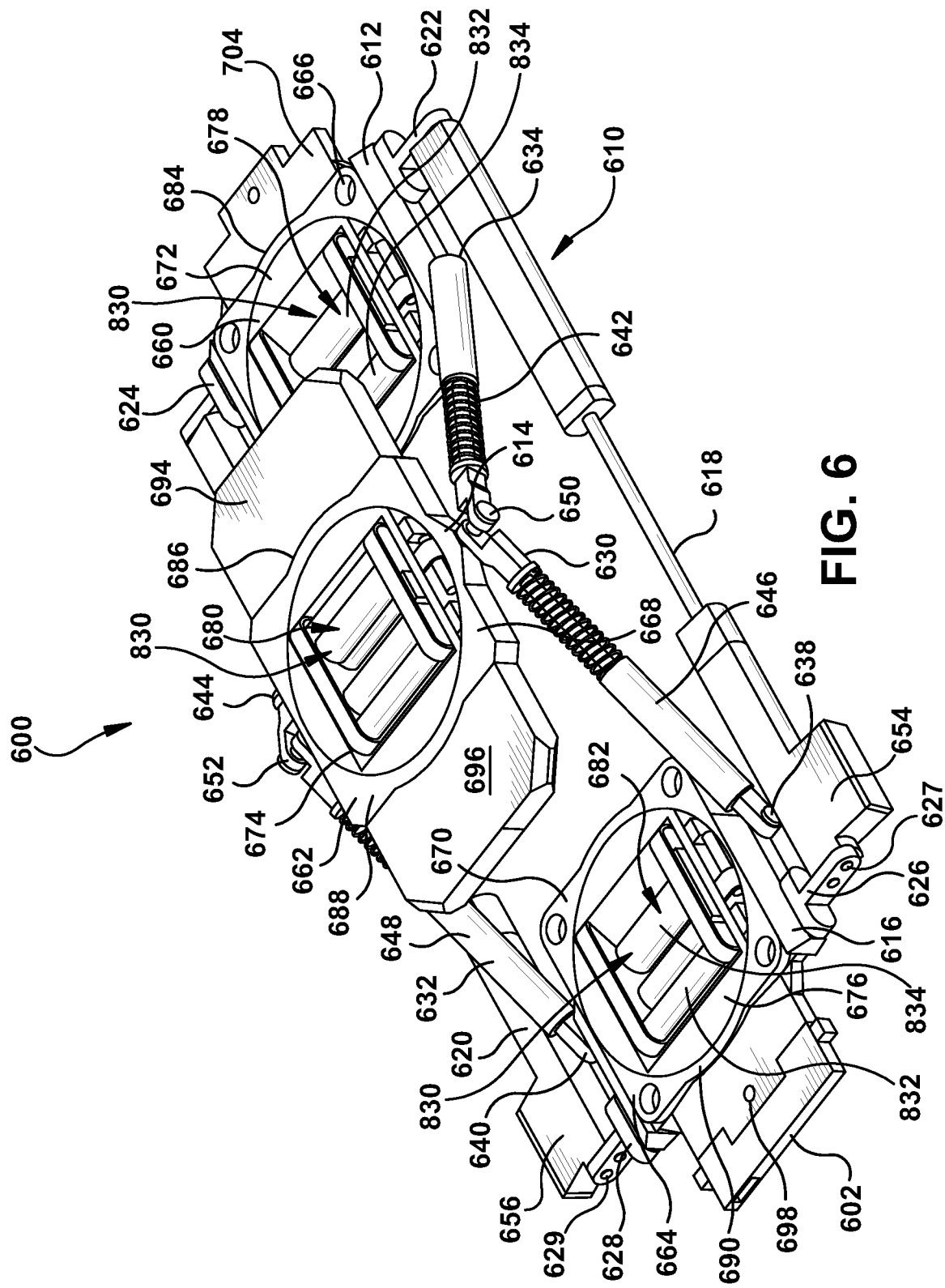
FIG. 6 shows a perspective view of a robotic crawler in its expanded state according to various embodiments of the disclosure.

Referring to FIGS. 6-8, an additional embodiment of a robotic crawler 600 is shown in several views and including an expanded state in FIG. 6 and a collapsed state in FIGS. 7-8. In some embodiments, robotic crawler 600 is a modular robot with an expandable body 610 including plurality of frames 612, 614, 616 for accommodating removable modules. Removable modules may include traction modules 660, 662, 664 that provide one or more traction drive components 678, 680, 682 such as but not limited to: rollers such as wheels or balls; or tracks or belts; or another form of locomotion for moving robotic crawler 600 along the surfaces within a gap. Robotic crawler 600 may also accommodate a plurality of sensor modules, such as navigation sensors, visual inspection sensors, structural test sensors, or electrical test sensors, using sensor interfaces that provide mechanical and/or electrical/communication/control between robotic crawler 600 and the sensor modules. For example, one or more frames may include sensor interfaces and/or the traction modules or other sensor modules may include sensor interfaces for chaining multiple modules from a single frame. The plurality of sensor interfaces may be provided at several positions on robotic crawler 600 to provide different operating positions for various sensors. For example, each frame 612, 614, 618 or traction modules 660, 662, 664 may include one or more sensor interfaces and related sensor positions. In some embodiments, there may be multiple configurations of sensor interfaces. For example, sensor interfaces for attachment to frames 614, 616, 618 or traction modules 660, 662, 664 may be different than sensor interfaces between serial sensor interfaces. Other modules may also be provided for other functions, such as a tether connector module 602.

In some embodiments, expandable body 610 includes generally rectangular base frame and includes lateral members 618, 620 on the long sides of the rectangle, connected to front frame 612 and rear frame 616, the latter providing the short sides of the rectangle. Lateral members 618, 620 may include frame attachments 622, 624, 626, 628 proximate their respective distal ends. Frame attachments 622, 624 may connect to front frame 612 and frame attachments 626, 628 may connect to rear frame 616. In some embodiments, middle frame 614 may be configured to be displaced from the plane of front frame 612 and rear frame 616 to expand the width of expandable body 610 in its expanded state. At least one link member may position a traction module against a surface in the annular gap. Middle frame 614 may be attached to extension link members 630, 632, which are connected to the rectangular base frame. For example, extension link members 630, 632 may include pivoting attachments 634, 636, 638, 640 with front frame 612 and rear frame 616 or, alternately, with lateral members 618, 620 proximate their distal ends. Extension link members 630, 632 may be articulated link members with first links 642, 644 and second links 646, 648 having pivoting attachments 650, 652 to middle frame 614. Pivoting attachments 650, 652 may act as an articulated joint in extension link members 630, 632 and move middle frame 614 perpendicular to the plane of the rectangular base frame. Expandable body 610 may include a motor or other actuator for moving middle frame 614. For example, lateral members 618, 620 may include linear actuators 654, 656 for moving front frame 612 relative to rear frame 616, changing the lengths of lateral members 618, 620 and the distance between front frame 612 and rear frame 616. When lateral members 618, 620 are in their fully extended positions, front frame 612, middle frame 614, and rear frame 616 may be in the same plane and expandable body 610 is in its narrowest or collapsed state. As lateral members 618, 620 are shortened by linear actuators 654, 656 and rear frame 616 moves toward front frame 612, extension link members 630, 632 articulate at pivoting attachments 650, 652 and first links 642, 644, second links 646, 648, and lateral members 618, 620 form an isosceles triangle with middle frame 614 moving in a direction perpendicular to the direction of movement between front frame 612 and rear frame 616. Other configurations of expandable bodies are possible, such as one or more frames being mounted on lever arms, scissor jacks, telescoping members, or other displacement mechanisms. In some embodiments, expandable body 610 may incorporate shock absorbers between front frame 612 and rear frame 616 and middle frame 614 to assist in navigating uneven gap spaces. For example, extension link members 630, 632 may incorporate telescoping links with an internal spring to assist with traction on opposed gap surfaces and compensate for some obstacles and/or changes in gap spacing. In some embodiments, lateral members 618, 620 may include emergency releases 627, 629 to disengage lateral members 618, 620 manually in the event of power loss or other failure that prevents control of linear actuators 654, 656. For example, frame attachments 626, 628 may incorporate mechanical fasteners that attach lateral members 618, 620 to frame attachments 626, 628 and these mechanical fasteners may act as emergency releases 627, 629 by enabling a user to release the mechanical fasteners and thereby disengage lateral members 618, 620 to cause expandable body 610 to collapse into its collapsed state. In some embodiments, emergency releases 627, 629 may be screws, bolts, or pins through frame attachments 626, 628 and into lateral members 618, 620 that may be removed to collapse expandable body 610. In some embodiments, expandable body 610 has a lateral shape that is an arc based on the configuration of frames 612, 614, 616 and lateral members 618, 620, most visible in FIG. 8. The arc of expandable body 610 may be configured to complement the curvature of an annular gap in which robotic crawler 600 is intended to operate. For example, the arc or curvature may be similar to the arc of the outer surface of the central cylindrical member or the inner surface of the surrounding cylindrical member that define the annular gap.

In some embodiments, each of frames 612, 614, 616 are configured to receive, position, and retain traction modules 660, 662, 664. For example, traction modules 660, 662, 664 may each be multidirectional traction modules with fixed outer frames 666, 668, 670 to removably attach to frames 612, 614, 616. Traction modules 660, 662, 664 may include rotating inner frames 672, 674, 676 that enable robotic crawler 600 to change the orientation of traction drive components 678, 680, 682 and direction of movement. Each of traction modules 660, 662, 664 may also include one or more interfaces 684, 686, 688, 690 that may be used to attach sensor modules or other functional modules, directly or in series. For example, traction module 660 may include interface 684 and is shown with a visual sensor module 692. Traction module 662 may include interfaces 686, 688 and visual sensor modules 694, 696. Traction module 664 may include interface 690, visual sensor module 698, and tether connector module 602.

FIGS. 9-15 show various views of an example multidirectional or omnidirectional traction module 800 according to various embodiments. Multidirectional generally refers to the ability to go in more than one direction. However, as used herein, it refers to more than two directions (e.g., more than just forward and reverse for a fixed drive system) to include the ability to change angular orientation. For example, a multidirectional robot may move in both axial and circumferential orientations and forward and reverse in both orientations, providing movement in at least four directions. A drive system capable of a 90 degree change in orientation, in addition to forward and reverse, may be an effectively multidirectional drive system. Multidirectional may include more than two operable orientations as well, such as positions between the 90 degree change from axial and circumferential orientation. Omnidirectional refers to the ability to select any orientation around a 360 degree arc, within reasonable control parameters. Omnidirectional traction modules may be a subset of multidirectional traction modules. The combination of a 180 degree rotational arc for orientation changes and a reversible drive systems (forward/reverse) may provide effective omnidirectional navigation. In some embodiments, a traction module may be continuously omnidirectional, meaning that there is no limitation to how many times it may rotate around its 360 degree arc in one direction or another. In general, continuously omnidirectional drive systems may not be constrained by fixed connections, such as wires, that may limit rotations. In other embodiments, a traction module may be only partially omnidirectional, meaning that there is a limitation to how far it can rotate a 360 degree arc in one direction or another.

Traction module 800 may be configured for use in a robotic crawler, such as robotic crawlers 110, 210, 510, 600. Traction module 800 may also be configured for use in other modular robots. Traction module 800 enables the direction and orientation of travel of a robotic crawler to be changed without changing the orientation of the robotic crawler itself. In some embodiments, a plurality of traction modules, such as traction module 800, may be attached to the same robot but independently controlled to enable each to change orientation independently, further increasing the maneuverability of the robot to which they are attached.

FIG. 9 shows a perspective view of a traction module 800 according to various embodiments of the disclosure. Traction module 800 may include an outer frame 810 with one or more attachment features 812, 814 configured for attachment to a robotic crawler, such as insertion into a frame 612, 614, 616 (FIGS. 6-7). In some embodiments, traction module 800 may also include an electrical interconnect 816 for power and/or control signals from control system 150 (FIG. 1) to traction module 800.

Traction module 800 may also include a rotating frame 820 rotatably mounted within outer frame 810, and capable of rotational movement relative to outer frame 810. Outer frame 810 is fixed in position relative to a frame 612, 614, 616 (FIGS. 6-7). Rotating frame 820 is seated within fixed outer frame 810. Outer frame 810 includes a plurality of fixed cams 818 extending radially inward from an inner periphery 819 of outer frame 810. Cams 818 can include any form of bearing surface or rotating bearing surface.

Figure 10:
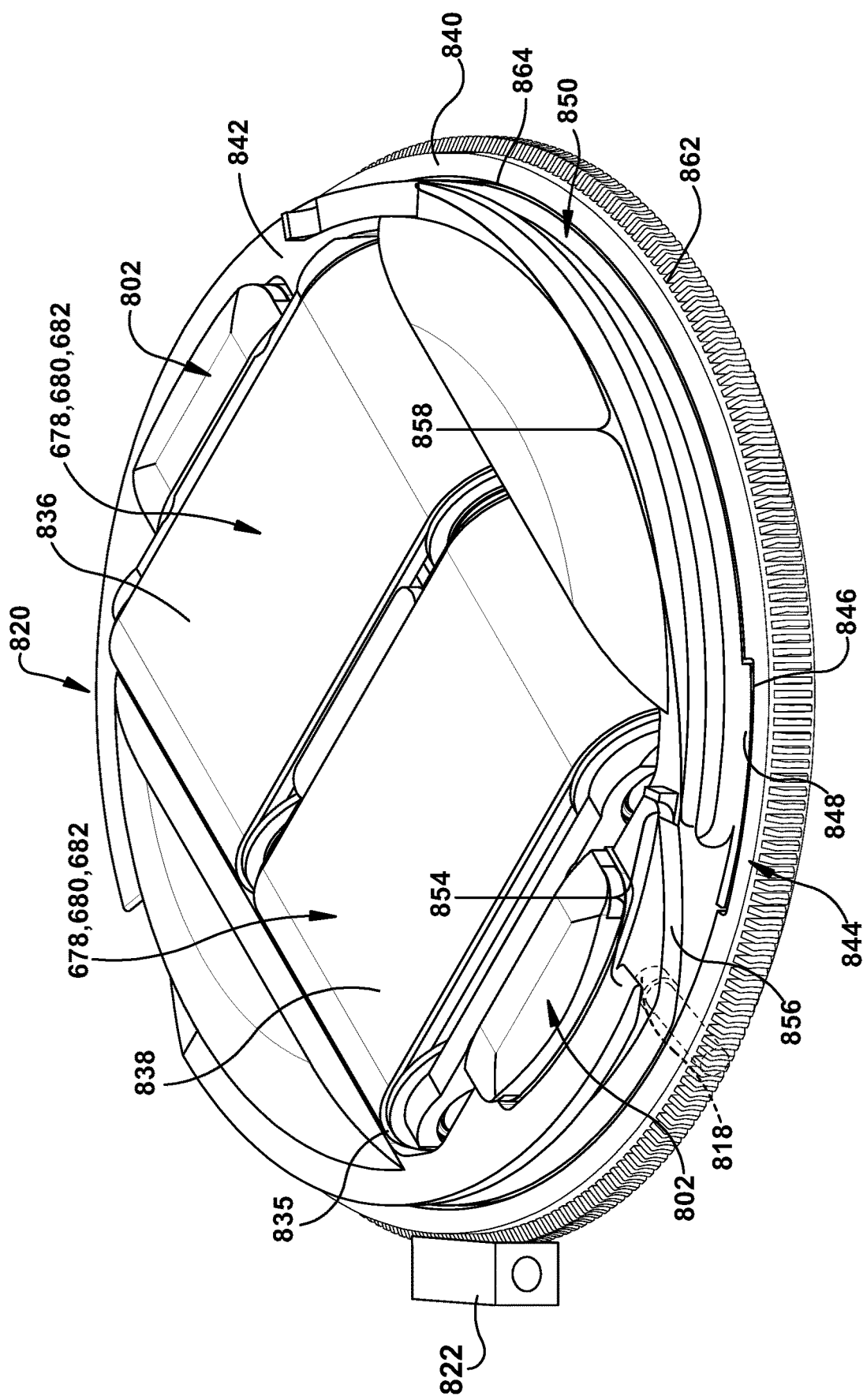
FIG. 10 shows an exploded perspective view of a rotating frame of a traction assembly according to various embodiments of the disclosure.
Figure 11:
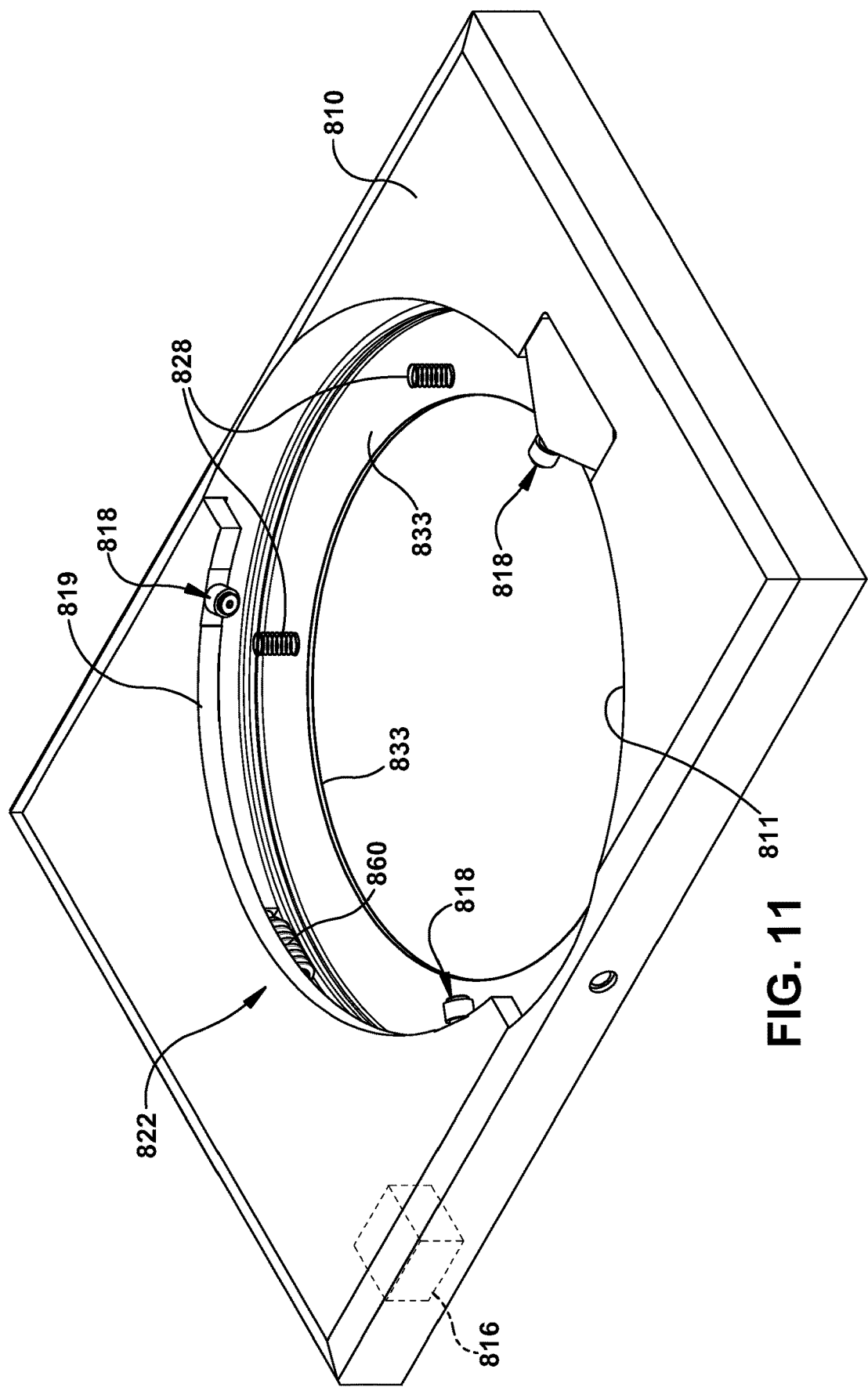
FIG. 11 shows a perspective view of an outer frame of the traction module of FIG. 9 without a rotating frame.
Figure 14:
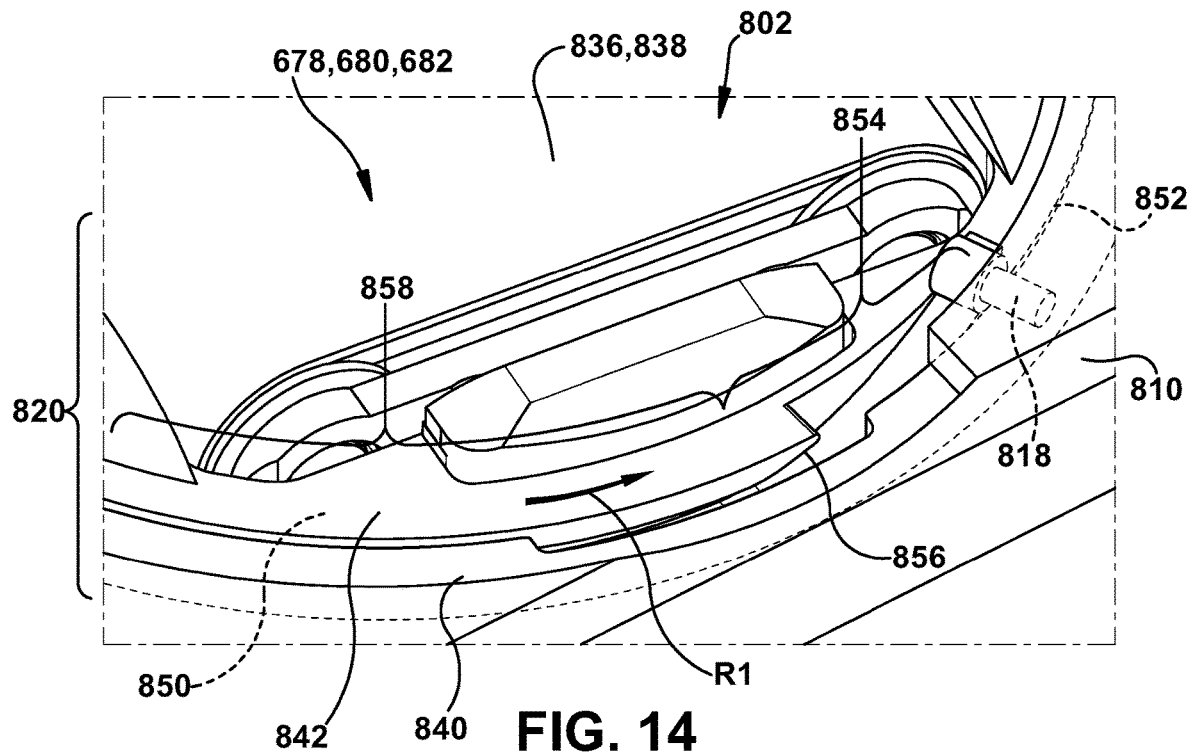
FIG. 14 shows an enlarged perspective view of the rotating frame of the traction module in the flat mode according to various embodiments of the disclosure.

FIG. 10 shows an exploded perspective view of rotating frame 820, and FIG. 11 shows a perspective view of outer frame 810 with rotating frame 820 removed. Rotating frame 820 is configured to rotate to allow positioning of a drive system 802 in a desired orientation to propel the robot, but also includes ramps 856 configured to move drive system 802 to extend farther from outer frame 810 for contact with a surface upon which the drive system propels the robot during part of its rotational movement. More particularly, during a first portion of a rotating movement of rotating frame 820, rotating frame 820 causes drive system 802 to move between a first position relative to outer frame 810 and a second position in which drive system 810 extends outwardly from outer frame to a greater extent than in the first position. During a second portion of the rotating movement of rotating frame 820, rotating frame 820 positions drive system 802 in a desired orientation to propel the robot. Referring to the side views of FIGS. 12-15, in accordance with embodiments of the disclosure, an actuator 822 may rotate rotating frame 820 to move drive system 802 between a first (flat mode) position (FIGS. 12 and 14), relative to outer frame 810 that provides a lower profile and a second (obstacle or clearance mode) position (FIGS. 13 and 15) in which drive system 802 extends outwardly from outer frame 810 to a greater extent than in the first position (FIGS. 12 and 14). In this manner, the clearance between robotic crawler 110 and the surfaces it is traveling on can be more carefully controlled.

FIG. 12 shows drive system 802, e.g., with traction drive components 678, 680, 682 thereof, in the first position extending a minimal distance P1 from outer frame 810, and FIG. 13 show drive system 802 in the second position extending a greater distance or extent P2 from outer frame 810, i.e., P2>P1. In the flat mode, drive system 802 does not extend as far radially from outer frame 810 relative to axis of cylindrical central member 226 (FIG. 2). In the clearance mode, depending on location of outer frame 810, drive system 802 may extend more radially inward (when it is on the cylindrical central member) or more radially outward (when it is on surrounding cylindrical member 224 (FIG. 2)), compared to the flat mode. In the flat mode, each axis of rotation 804 of traction drive components, such as rollers 832, 834 or roller gears 833, 835 (as the case may be), may be aligned in a shared, single plane with a longitudinal axial plane AF of outer frame 810. In clearance mode, each axis of rotation 804 of the traction drive components (rollers 832, 834 or roller gears 833, 834) are out of the shared, single plane of longitudinal axial plane AF, and define a distinct plane DP of operation. Plane DP is distinct from plane AF. As will be further described, traction drive components 678, 680, 682 may be in any desired orientation for moving robot crawler 110.

As shown in FIG. 10, rotating frame 820 may include an outer circular member 840 positioned for rotational movement in outer frame 810, and an inner member 842 operatively coupled to drive system 802. Drive system 802 is positioned for use in rotating frame 820. For example, a portion of traction drive component(s) 678, 680, 682 extend from inner member 842 to allow contact with inner surface 234 (FIG. 2) surrounding cylindrical member 224 (FIG. 2) or outer surface 236 (FIG. 3) of cylindrical central member 226 (FIG. 3).

Inner member 842 moves in a non-rotating, telescoping manner relative to outer circular member 840 as inner member 842 moves drive system 802 between the first and second position. Further, inner member 842 and outer circular member 840 do not rotate relative to one another. In some embodiments, traction module 800 may include a guide system 844 including a first element 846 on outer circular member 840 and a mating second element 848 on inner member 842. First and second elements 846, 848 are configured to maintain non-rotational telescoping movement of inner member 842 relative to outer circular member 840 as the inner member moves from the first position to the second position. In one example, first element 846 includes a slot on an inner periphery of outer circular member 840 and second element 848 includes a mating guide element on an outer periphery of inner member 842 and configured to slidingly move in a respective slot. In this manner, first and second elements 846, 848 slidingly engage to prevent rotation of outer circular member 840 and inner member 842, and direct or guide non-rotational telescoping movement thereof as inner member 842 moves between the first and second positions. Any number of guide systems 844 may be provided about outer circular member 840 and inner member 842. While a slot and extension (female-male) arrangement has been illustrated, a wide variety of alternative embodiments may be applicable and are considered within the scope of the disclosure. The position of the slot and extension may also switch, if desired.

Figure 16:
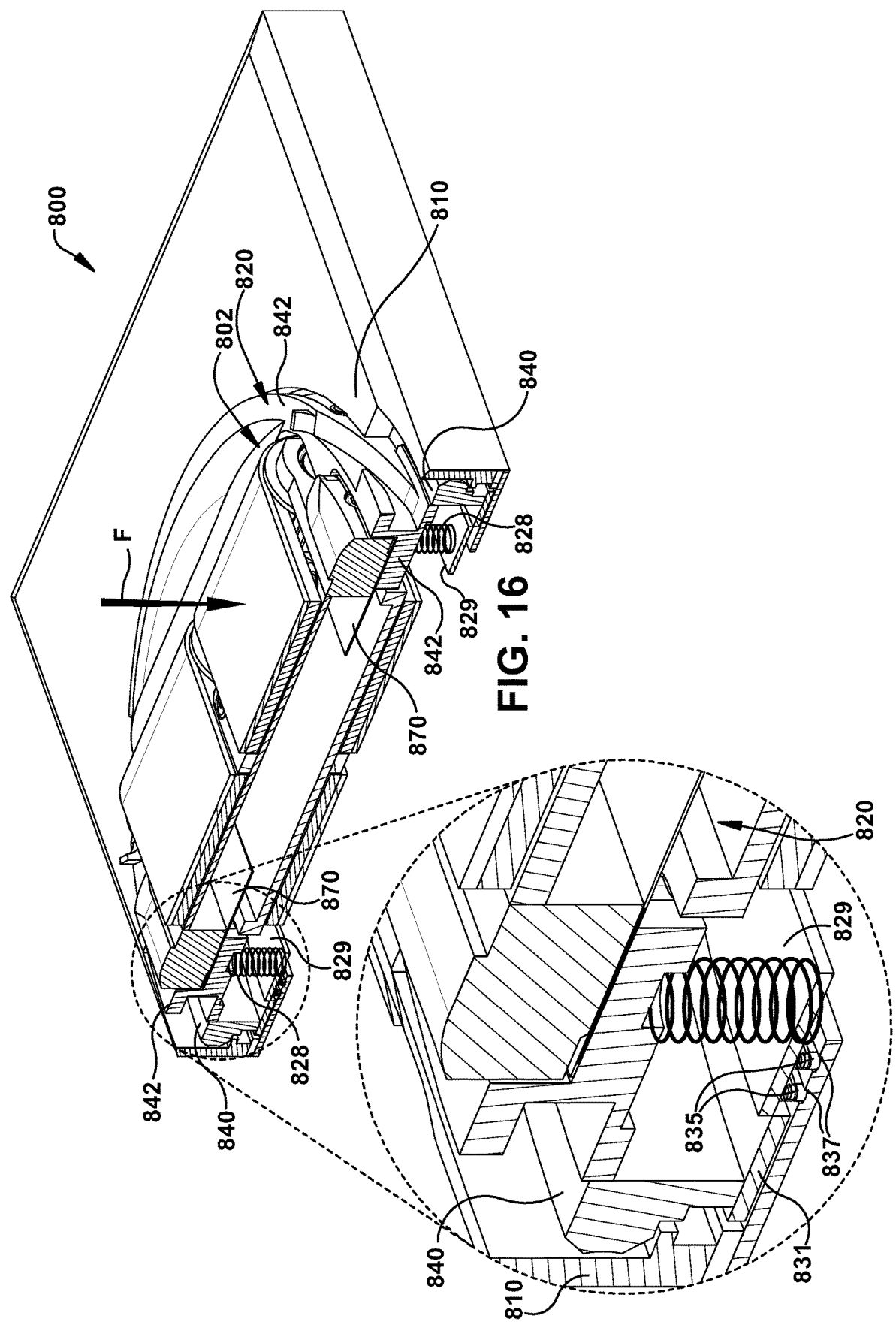
FIG. 16 shows a cross-sectional view of the rotating frame and the outer frame of the traction module according to various embodiments of the disclosure.

As shown in a cross-sectional view of FIG. 16, traction module 800 may include a biasing member 828 to force inner member 842 towards the second position. Biasing member 828 may include any now known or later developed biasing system, e.g., compression springs, hydraulic or pneumatic rams, spring clips, etc. Any number of biasing members 828 may be employed. Biasing member(s) 828 may be positioned in any location desired. In FIG. 16, biasing member(s) 828 are compression springs positioned between a brush board plate 829 that rotates with outer circular member 840 and a bottom surface of inner member 842 that rotates and translationally moves relative to outer circular member 840 under the bias of the biasing member(s) 828. FIG. 16 also shows a bearing 831 of rotating frame 820 that bears against a slip ring board 833 (see also FIG. 11) of outer frame 810. Slip ring board 833 and brush board plate 829 may include any now known or later developed system for maintaining electrical communication between rotating parts such as but not limited to spring loaded pins 835 that contact tracks 837. The pins and tracks are electrically coupled to outer frame 810 (and the rest of robot crawler 110) and drive system 802, respectively, and allow constant electrical connection despite the relative rotation of the parts.

Figure 15:
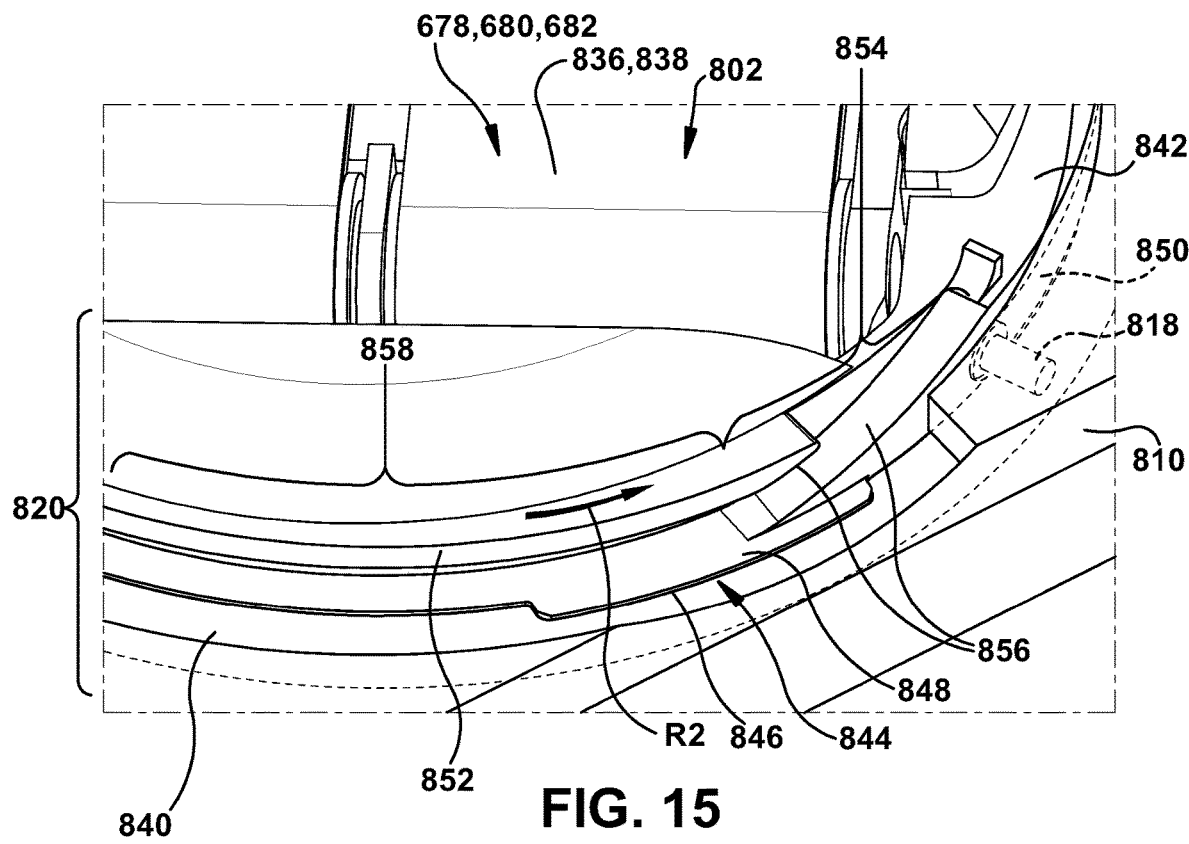
FIG. 15 shows a perspective view of a clearance mode of the traction module according to various embodiments of the disclosure.

As shown for example in FIGS. 10, 14 and 15, inner member 842 may include a plurality of grooves 850 exposed on a circumferential face 852 of inner member 842. Each groove 850 extends partially about circumferential face 852 of inner member 842. For example, each groove 850 may extend across an approximately 120 degree total arc. Each groove 850 includes a first section 854 having a ramp 856 configured to interact with a respective fixed cam 818 (FIGS. 11, 14 and 15) of outer frame 810 during the first portion of the rotating movement of rotating frame 820 to move drive system 802 between first position (FIGS. 12 and 14) and second position (FIGS. 13 and 15). Each ramp 856 can extend at an angle and length relative to outer frame 810 to create the desired extension of drive system 802 from outer frame 810. The angle and length can be, for example, user and/or application specific. Each groove 850 may also include a second section 858 contiguous with first section 854 and configured to interact with a respective fixed cam 818 (FIGS. 11, 14 and 15) during the second portion of the rotating movement of rotating frame 820 to rotate drive system 802 to the desired orientation to propel the robot. Second section 858 is substantially planar, allowing rotation of rotating frame 820 and thus drive system 802 while maintaining the extent that drive system 802 extends from outer frame 810 set by the ramp's 856 positioning. First section 854 may include, for example, between 20-25 degrees of the 120 degree total arc of the respective groove 850, and second section 858 may include the remaining portion of the groove. In some embodiments, three groove and fixed cam combinations are used. In this case, each groove 850 extends an approximately 120 degree total arc, which provides sufficient rotation of drive system 802 with multidirectional control for traction drive components 678, 680, 682 to allow propulsion in any direction. A fewer number of groove 850 and fixed cam 818 combinations may be employed with the understanding that some limitation in the available direction of propulsion of the robot may need to be accepted due to the limited rotational movement of drive system 802. Ramps 856 in grooves 850 collectively form a helical section about rotating frame 820.

Traction module 800 may also include an actuator 822 operatively connected to rotating frame 820 to controllably rotate the rotating frame. Actuator 822 may be connected to rotating frame 820 and/or outer frame 810 of traction module 800. Actuator 822 includes a motor for applying a rotational force to outer circular member 840 to cause the rotating movement of the rotating frame. As will be described further, rotating frame 820 may rotate a certain amount to change between the flat and clearance modes, may rotate another amount, e.g., 90 degrees, to change the orientation and direction of travel, and may rotate in other amounts to steer in a desired direction of travel. In some embodiments, rotating frame 820 may traverse or be stopped in various positions or orientations along at least a 90 degree arc and/or up to a 120 degree arc, depending on the arcuate length of second section 858. Actuator 822 may take any variety of forms for driving rotational movement of rotating frame 820. In some embodiments, actuator 822 may include a lead screw 860 (FIG. 11)(coupled to the motor) that engages a mating, geared edge 862 (FIG. 10) on an outer periphery 864 (FIG. 10) (diameter) of outer circular member 840 such that rotation of the shaft of the worm gear translates into a defined angular change in the orientation of rotating frame 820. In another example (not shown), a drive wheel (coupled to the motor) may engage a smooth edge of outer periphery 864 of a portion of rotating frame 820 such that rotation of the shaft of the drive wheel translates into a defined angular change in the orientation of rotating frame 820. A large variety of alternative rotational actuator systems may also be employed. A position encoder 866 (FIG. 9) may be provided to measure the angular position or orientation of rotating frame 820. In some embodiments, as shown in FIG. 9, position encoder 866 (FIG. 9) may include an optical sensor using perhaps reference arcs 824, 826 to provide visual reference through reflective and non-reflective coatings to allow encoder 866 to ascertain the orientation of traction module 800. In another embodiment, the position encoder may include a magnetic encoder that is connected to actuator 822 and can detect a position of rotating frame 820 based on a parameter of actuator 822, e.g., the number of rotations of lead screw 860 (FIG. 11) that are correlated to the angular position of the rotating frame. In another embodiment, position encoder 866 may include two encoders, a first one in the motor of actuator 822, and a second one (e.g., magnetic) at the output of lead screw 860, e.g., the shaft of the worm gear. The measurements of the encoders can be correlated to the angular position of rotating frame 822. In any event, control system 150 (FIG. 1) of robot 108 (FIG. 1) may use the angular position of rotating frame 820 to steer the robot.

Traction module 800 may also include a drive system 802 operatively coupled to rotating frame 820 and configured to drive a traction drive component 678, 680, 682 (FIGS. 6, 9 and 10) to propel the robot. A drive system or drive 802 may be any powered system of mechanical locomotion, including traction drive component(s) 678, 680, 682 such as but not limited to rolling systems like rollers, wheels or balls; or belts or tracks, or other systems, with their associated actuators (e.g., electric motors). In some embodiments, as shown in FIG. 6, traction drive components 678, 680, 682 may include a roller assembly 830 disposed within rotating frame 820 and include a configuration of rollers 832, 834 for providing rotating traction to move the robotic crawler in a direction of rotation. Roller assembly 830 may also include a motor or other actuator for rotating rollers 832, 834. Roller assembly 830 and/or rotating rollers 832, 834 and their respective actuators may be examples of traction drive components, drive systems or drives. In some embodiments, as shown in FIGS. 9 and 10, traction drive components 678, 680, 682 may include belt or track drives 836, 838 to provide traction for traction module 800. For example, belt or track drives 836, 838 may substantially cover the length of rollers or roller gears 833, 835 to provide a large contact area with adjacent machine surfaces. In some embodiments, the combined width of the belts or tracks may be at least half the total width of rotating frame 820. In some embodiments, belt or track drives 836, 838 may include surface features or treatments to improve traction, such as a textured surface for providing grip on oily surfaces. In any event, traction drive components 678, 680, 682 may be driven in a forward or reverse direction in addition to changes in orientation by rotation of rotating frame 820. In some embodiments, the motion and direction of belt or track drives 836, 838 may be independently controlled. Driving rollers or roller gears 833, 835 and belt drive 838 in one direction while driving corresponding rollers or roller gears (not shown) and belt drive 836 in the opposite direction may actuate the change in orientation.

Referring again to the cross-sectional view of traction module 800 in FIG. 16, some embodiments of traction module 800 may include a force sensor 870 positioned between drive system 802 and rotating frame 820 to measure a force applied to drive system 802 during operation. Force sensor 870 may provide a force measurement signal to control system 150 (FIG. 1) to adjust an operating position of traction module(s) 800 to change a surface contact force between traction module(s) and a surface upon which drive system 802 propels the robot frame. That is, the force measurement may be used to control surface contact between traction module 800 and a surface 234, 236 (FIGS. 2 and 3) upon which drive system 802 propels the robot. For example, control system 150 may use the force measurement signal to control body frame (e.g., expansion and/or contraction thereof), drive system 802 and/or actuator 822. Actuator 822 may be controlled to move drive system 802 between the flat mode and clearance mode positions and to move drive system 802 to the desired orientation. Drive system 802 may be controlled to propel the robot.

Figure 17:
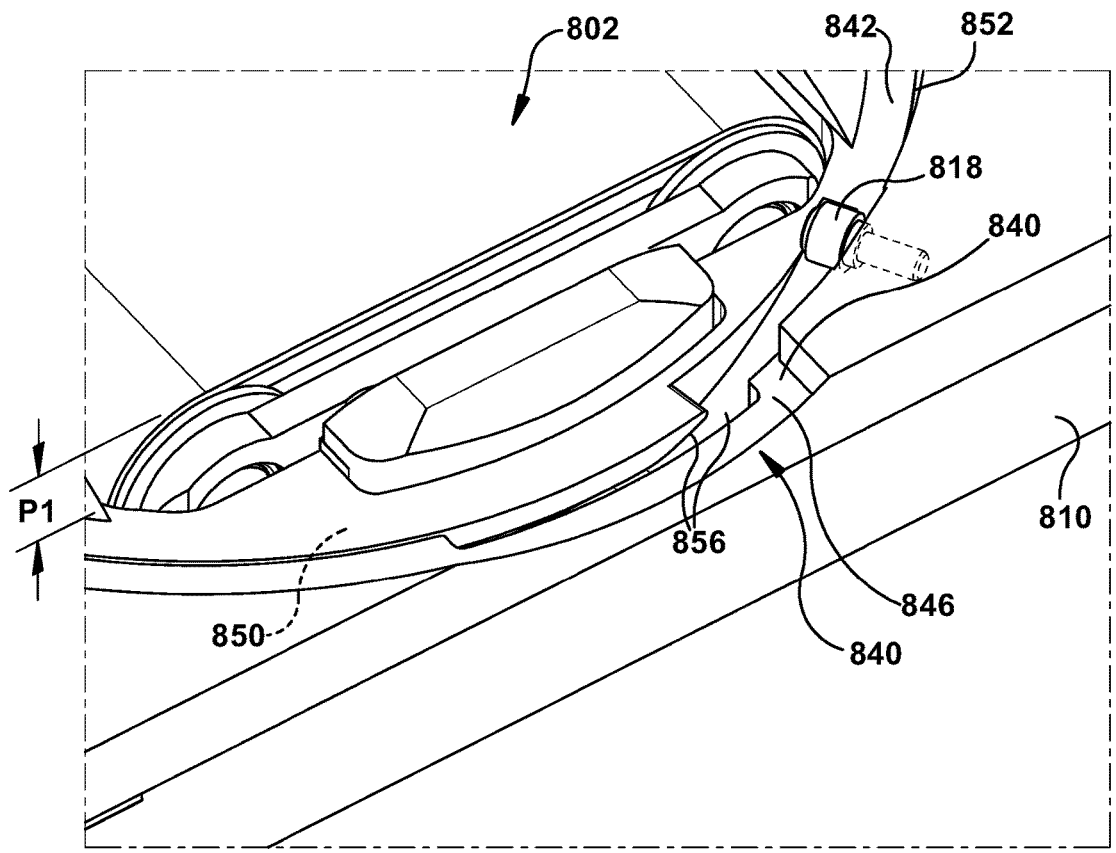
FIG. 17 shows an enlarged perspective view of a groove and fixed cam of the traction module in the flat mode according to various embodiments of the disclosure.
Figure 18:
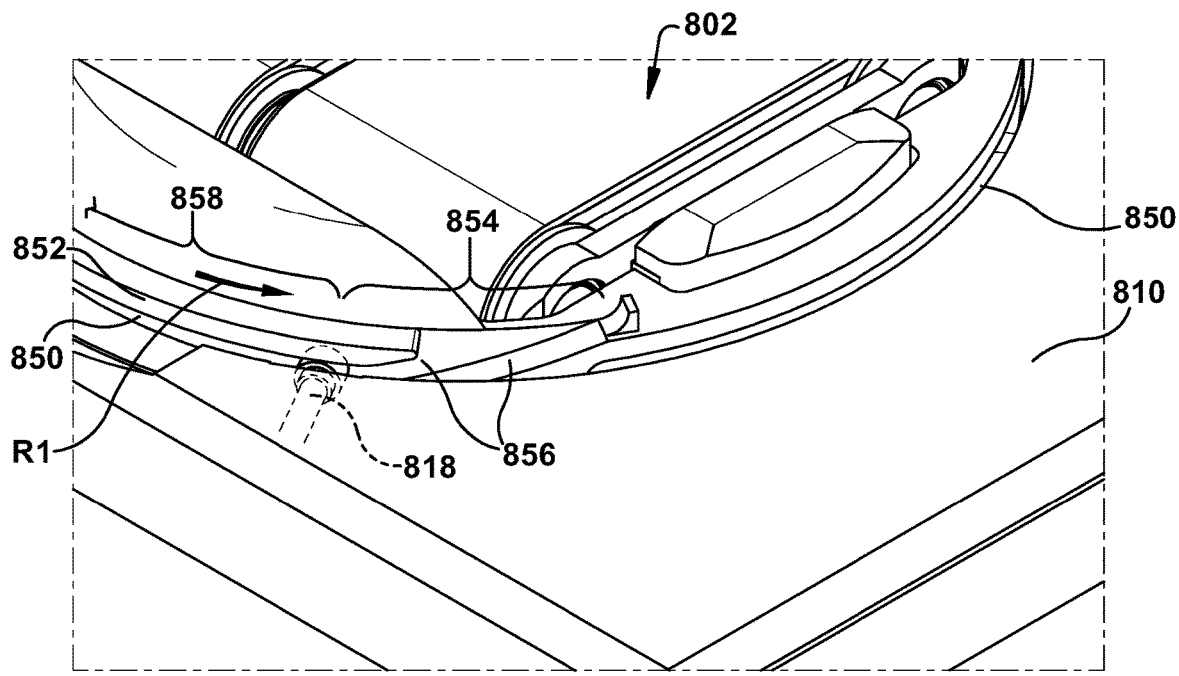
FIG. 18 shows an enlarged perspective view of a groove and fixed cam of the traction module in the clearance mode according to various embodiments of the disclosure.
Figure 19:
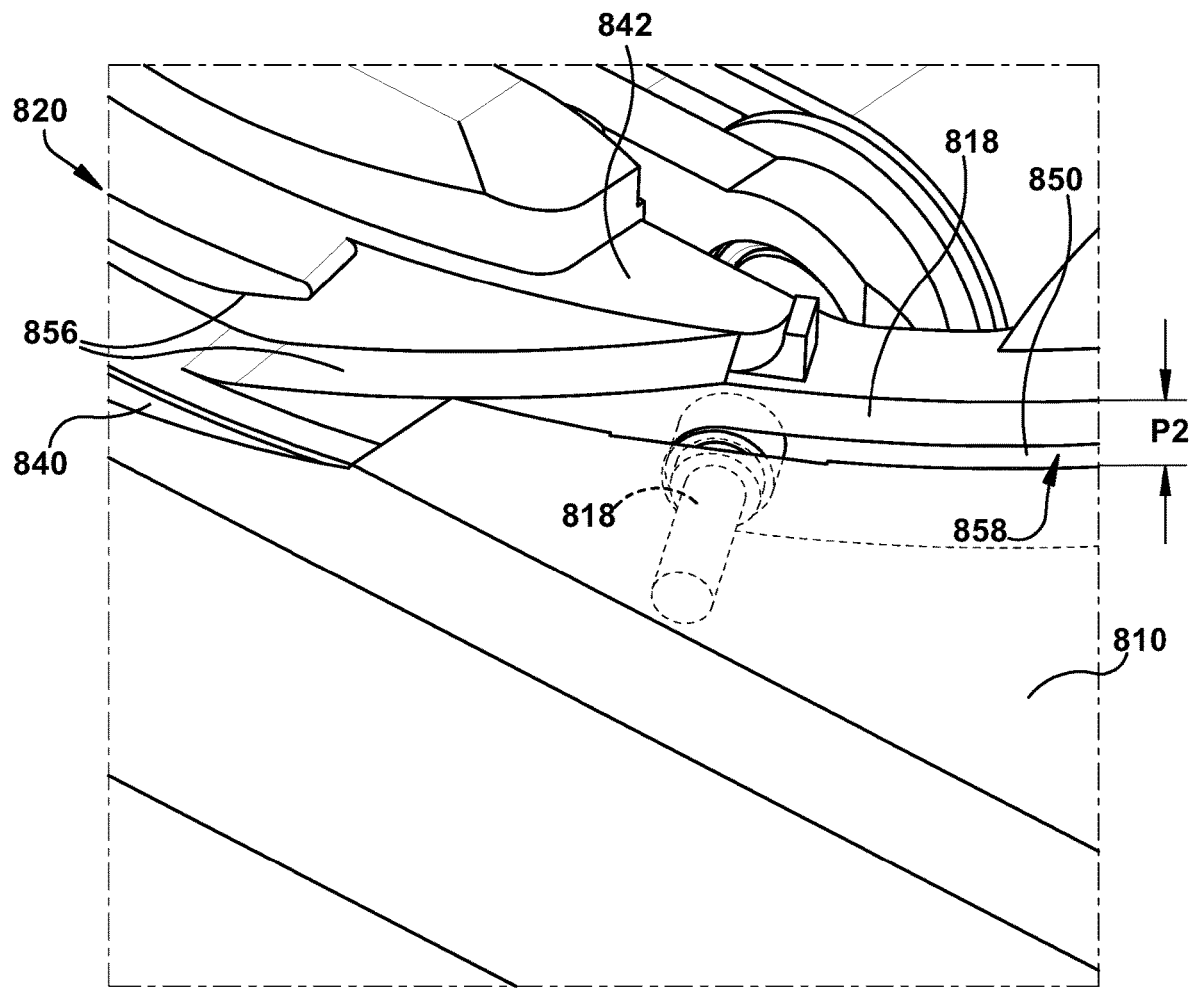
FIG. 19 shows an enlarged perspective view of a groove and fixed cam of the traction module in the clearance mode and with a drive system in a desired orientation according to various embodiments of the disclosure.

Referring to FIGS. 12-15 and the enlarged perspective views of a groove 850 and cam 818 interface in FIGS. 17-19, operation of rotating frame 820 and actuator 822 (FIGS. 9 and 10) will be described. FIGS. 12, 14 and 17 show inner member 842 and drive system 802 therein in first (flat mode) position. At this position, each cam 818 is in a position at an upper end of ramp 856 such that inner member 842 is resting fully within outer member 840 and is retained therein by cams 818 against the bias of biasing members 828 (FIGS. 11 and 16). Drive system 802 in inner frame 842 is in the first (flat mode) position, and can be readily placed within the annular gap, as shown in FIG. 2. Once in the annular gap, as shown in FIG. 3, the expandable rotor body may be expanded to bring drive systems 802 into engagement or near engagement with surfaces 234, 236. At this stage, actuator 822 may be activated to rotate rotating frame 820 during at least a first portion of its possible full rotational movement. As shown in FIG. 17, during the first portion of the rotating movement R1 of rotating frame 820 to move inner member 842 and drive system 802 from the first position (FIGS. 12, 14 and 17) to the second position (FIGS. 13, 15 and 19), each fixed cam 818 engages with ramp 856 of first section 854 of a respective groove 850. Ramps 856 gradually force inner member 842 and drive system 802 outwardly from outer frame 810 as cams 818 move along ramps 856. As rotation of rotating frame 820 occurs, first and second elements 846, 848 of guide system 844 allow non-rotating telescoping movement of inner member 842 relative to outer circular member 840, i.e., guide system 844 slidingly guides inner member 842 relative to outer circular member 840. The distance inner member 842 and drive system 802 moves outwardly from outer circular member 840 can be user and/or application specific. For example, it can be chosen to apply a certain force to traction module 800. When cams 818 reach an end of ramps 856, i.e., the end of first section 854 of grooves 850, they enter second section 858 of grooves 850, which is planar. During a second portion R2 of the full rotating movement of rotating frame 820, each fixed cam 818 engages with second section 858 of a respective groove 850 to rotate drive system 802 to a desired orientation for propelling the robot. Drive system 802 and inner member 842 are maintained in the second position (FIGS. 13, 15 and 18) during continued rotation of rotating frame 820 to position drive system 802 in the desired orientation to propel the robot. FIG. 18 shows cams 818 in second section 858 of grooves 850 at a full rotation of rotating frame 820.

Figure 20:
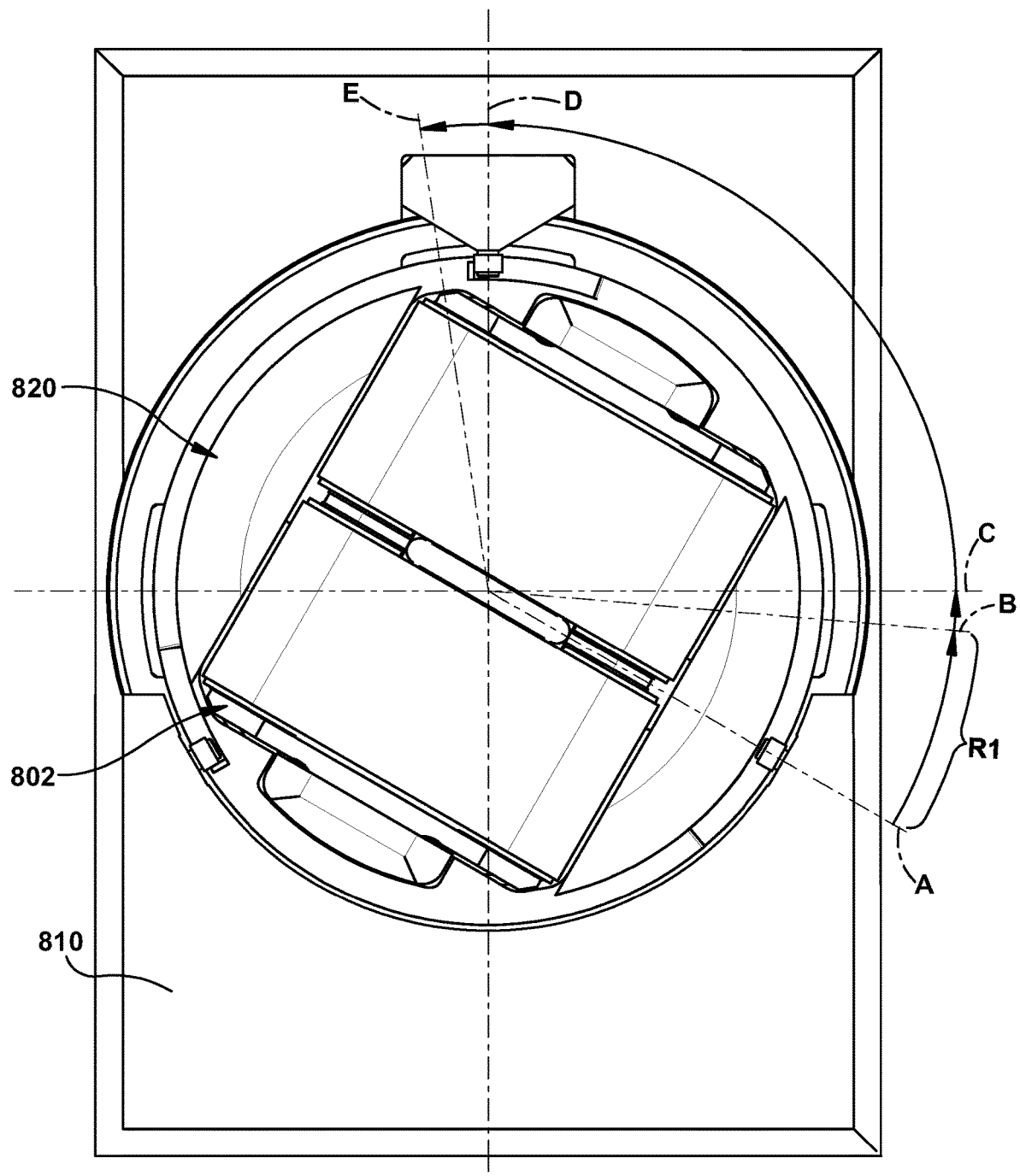
FIG. 20 shows a plan view of the traction module with an overlay of potential rotating frame positions according to various embodiments of the disclosure.

To further illustrate operation of rotating frame 820, FIG. 20 shows a schematic planar view of an example rotational movement of rotating frame 820. In flat mode, shown in FIGS, 9 and 12, rotating frame 820 is in the first (flat mode) position, allowing entry of robotic crawler 110 in to the annular gap. Position A corresponds to the first (flat mode) position shown in FIGS. 12, 14 and 17. In the example shown, rotating frame 820 is in position A. In the example shown, movement from point A to point B represents the first portion R1 of rotational movement of rotating frame 820. In one non-limiting example, the first portion R2 and dictated by a length of ramps 856 (FIG. 17) extends approximately 22 degrees. Rotation from points B through E represent the second portion R2 of rotational movement of rotating frame 820, and more particularly, the positioning of drive system 802 in a desired orientation to propel the body frame. That is, rotation of rotating frame from points B through E changes the direction of the motion (lateral, axial, diagonal, etc.) and provides steering control. In position B, drive system 802 is in an orientation to move the robot left or right on the page, which may align with a circumferential movement in FIGS. 2 and 3. Rotation between points B and C provides for circumferential steering, i.e., as the robot crawler moves circumferentially in the annular gap (e.g., along path 530 (FIG. 2)). Rotation from B to C may include, for example, approximately 3 degrees. Where the robot deviates from the inspection path due to gravity and/or other external forces, rotation between points B to C allows steering control to correct the misalignment and keep the robot on track, e.g., the mainly circumferential track. Rotation from point C to D allows for a change in direction of drive system 802 from circumferential movement to a position for axial movement, i.e., to allow the robot crawler to move axially in the annular gap (e.g., long path in FIG. 2). Rotation of rotating frame 820 may also be to any point between points C and D, allowing movement in a diagonal direction between circumferential and axial. Rotation from C to D may include, for example, approximately 90 degrees. In position D, drive system 802 is in an orientation to move the robot up or down the page, which may align with an axial movement in FIGS. 2 and 3. Rotation from point D to E may provide for axial steering, i.e., as the robot crawler moves axially in the annular gap. Rotation from D to E may include, for example, approximately 3 degrees. Where the robot deviates from the inspection path due to gravity and/or other external forces, rotation between points D to E allows steering control to correct the misalignment and keep the robot on track, e.g., the mainly axial track. Collectively, the arc from point A-E equals the total arc of grooves 850, e.g., 120 degrees.

Embodiments of the traction module with the rotating frame described herein combines steering and drive system lifting or extension with a single, simple solution. The traction module reduces the number of parts, complexity and costs while increasing system longevity. The less complex mechanism provides additional space for other parts such as larger traction drive components to improve traction and obstacle handling on uneven surfaces. Additionally, the active force measurement with the force sensors allow for contact force to be tracked in real time, and allows the robotic crawler to be operated with higher performance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A traction module for a robot, the traction module comprising:
    an outer frame;
    a rotating frame rotatably mounted within the outer frame;
    a drive system operatively coupled to the rotating frame and configured to drive a traction drive component to propel the robot, wherein the drive system includes a set of rollers; and
    an actuator operatively connected to the rotating frame to controllably rotate the rotating frame to:
    during a first portion of a rotating movement of the rotating frame, cause the drive system to move between a first position relative to the outer frame and a second position in which the drive system extends outwardly from the outer frame to a greater extent than in the first position, and
    during a second portion of the rotating movement of the rotating frame, position the drive system in a desired orientation to propel the robot.

2. The traction module of claim 1, wherein the outer frame includes a plurality of fixed cam extending radially inward from an inner periphery of the outer frame; and
    wherein the rotating frame includes:
    an outer circular member positioned for rotational movement in the outer frame;
    an inner member operatively coupled to the drive system, the inner member including a plurality of grooves exposed on a circumferential face of the inner member, each groove extending partially about the circumferential face of the inner member and including:
    a first section having a ramp configured to interact with a respective fixed cam during the first portion of the rotating movement of the rotating frame, to move the drive system between the first position and the second position; and
    a second section contiguous with the first section and configured to interact with the respective fixed cam during the second portion of the rotating movement of the rotating frame to rotate the drive system to the desired orientation.

3. The traction module of claim 2, wherein the actuator includes a motor for applying a rotational force to the outer circular member to cause the rotating movement of the rotating frame.

4. The traction module of claim 3, further comprising a guide system including a first element on the outer circular member and a mating second elements on the inner member, the first and second elements configured to allow non-rotational telescoping movement of the inner member relative to the outer circular member as the inner member moves from the first position to the second position.

5. The traction module of claim 4, wherein:
    during the first portion of the rotating movement of the rotating frame to move the inner member and the drive system from the first position to the second position, each fixed cam engages with the ramp of the first section of a respective groove, and the first and second elements of the guide system allows non-rotational telescoping movement of the inner member relative to the outer circular member; and
    during the second portion of the rotating movement of the rotating frame, each fixed cam engages with the second section of a respective groove to rotate the drive system to the desired orientation.

6. The traction module of claim 3, wherein the first element includes a slot on an inner periphery of the outer circular member and the second elements includes a guide element extending from an outer periphery of the inner member and configured to slidingly move in a respective slot.

7. The traction module of claim 2, further comprising a biasing member to force the inner member towards the second position.

8. The traction module of claim 2, wherein each groove extends approximately 120 degree total arc, and the first section includes between 20-25 degrees of the 120 degree total arc.

9. The traction module of claim 1, further comprising a position encoder that measures an angular position of the rotating frame, wherein a control system of the robot uses the angular position of the rotating frame to steer the robot.

10. The traction module of claim 1, wherein the robot is a robotic crawler with an expandable body for navigating an annular gap in a generator, electric motor, or turbomachine, and the robot further comprises at least one link member positioning the traction module against a surface in the annular gap.

11. The traction module of claim 1, further comprising a force sensor positioned between the drive system and the rotating frame to measure a force applied to the drive system, wherein the force measurement is used to control surface contact between the traction module and a surface upon which the drive system propels the robot.

12. A robot system including the traction module according to claim 1, the robot system comprising:
    a body frame; and
    a control system controlling the body frame, the drive system and the actuator.

13. A method of operating a traction module for a robot, the method comprising:
    providing a traction module including:
    an outer frame;
    a rotating frame rotatably mounted within the outer frame;
    a drive system operatively coupled to the rotating frame and configured to drive a traction drive component to propel the robot, wherein the drive system includes a set of rollers; and
    an actuator operatively connected to the rotating frame to controllably rotate the rotating frame; and
    rotating the rotating frame with the actuator such that:
    during a first portion of a rotating movement of the rotating frame, the drive system moves between a first position relative to the outer frame and a second position in which the drive system extends outwardly from the outer frame to a greater extent than in the first position, and
    during a second portion of the rotating movement of the rotating frame, the drive system moves to a desired orientation to propel the robot.

14. A traction module for a robot, the traction module comprising:
    an outer frame;
    a rotating frame rotatably mounted within the outer frame;
    a drive system operatively coupled to the rotating frame and configured to drive a traction drive component to propel the robot, wherein the drive system includes a first belt drive and a second belt drive, and wherein the first belt drive is controlled independently from the second belt drive; and
    an actuator operatively connected to the rotating frame to controllably rotate the rotating frame to:
    during a first portion of a rotating movement of the rotating frame, cause the drive system to move between a first position relative to the outer frame and a second position in which the drive system extends outwardly from the outer frame to a greater extent than in the first position, and
    during a second portion of the rotating movement of the rotating frame, position the drive system in a desired orientation to propel the robot.

\* \* \* \* \*